(12) United States Patent
Wang et al.

(10) Patent No.: US 9,312,139 B2
(45) Date of Patent: Apr. 12, 2016

(54) SEMICONDUCTOR ELEMENT HAVING CONDUCTIVE DAMASCENE STRUCTURES EXTENDING PERPENDICULAR TO DOPING STRIPS, AND MANUFACTURING METHOD OF THE SAME

(71) Applicant: MACRONIX INTERNATIONAL CO., LTD., Hsinchu (TW)

(72) Inventors: Ching-Hung Wang, Hsinchu (TW); Jyun-Siang Huang, Chiayi (TW); Chien-Hung Liu, Taipei (TW); Chia-Wen Cheng, Kaohsiung (TW); Ying-Tso Chen, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 248 days.

(21) Appl. No.: 13/891,238

(22) Filed: May 10, 2013

(65) Prior Publication Data
US 2014/0264545 A1 Sep. 18, 2014

Related U.S. Application Data

(60) Provisional application No. 61/778,625, filed on Mar. 13, 2013.

(51) Int. Cl.
*H01L 21/28* (2006.01)
*H01L 21/768* (2006.01)
*H01L 27/115* (2006.01)

(52) U.S. Cl.
CPC .... *H01L 21/28282* (2013.01); *H01L 21/76802* (2013.01); *H01L 27/11568* (2013.01)

(58) Field of Classification Search
None
See application file for complete search history.

(56) References Cited

U.S. PATENT DOCUMENTS

| | | | | |
|---|---|---|---|---|
| 6,855,608 B1 * | 2/2005 | Ramsbey | .......... | H01L 27/11573 257/E21.679 |
| 2002/0084526 A1 * | 7/2002 | Kasai | ................ | H01L 21/76802 257/758 |
| 2007/0004134 A1 * | 1/2007 | Vora | .................. | H01L 27/11556 438/257 |
| 2007/0051982 A1 * | 3/2007 | Bloom | ................ | H01L 21/0337 257/202 |

* cited by examiner

*Primary Examiner* — Steven Loke
*Assistant Examiner* — Juanita Rhodes
(74) *Attorney, Agent, or Firm* — McClure, Qualey & Rodack, LLP

(57) ABSTRACT

A semiconductor element and a manufacturing method of the same are provided. The semiconductor element includes a substrate, a plurality of doping strips, a memory material layer, a plurality of conductive damascene structures, and a dielectric structure. The doping strips are formed in the substrate. The memory material layer is formed on the substrate, and the memory material layer comprises a memory area located on two sides of the doping strips. The conductive damascene structures are formed on the memory material layer. The dielectric structure is formed on the doping strips and between the conductive damascene structures. The conductive damascene structures are extended in a direction perpendicular to a direction which the doping strips are extended in.

5 Claims, 37 Drawing Sheets

SEMICONDUCTOR ELEMENT HAVING CONDUCTIVE DAMASCENE STRUCTURES EXTENDING PERPENDICULAR TO DOPING STRIPS, AND MANUFACTURING METHOD OF THE SAME

This application claims the benefit of U.S. provisional application Ser. No. 61/778,625, filed Mar. 13, 2013, the disclosure of which is incorporated by reference herein in its entirety.

BACKGROUND

1. Technical Field

The disclosure relates in general to a semiconductor element and a manufacturing method thereof, and particularly to a semiconductor element and a manufacturing method thereof including conductive damascene structures.

2. Description of the Related Art

Conventionally, in a manufacturing process for forming a memory device, a whole polysilicon film is deposited and then etched to form word lines. Next, dielectric materials are filled into the spaces between the word lines. However, as the reduction of the sizes of memory devices, the widths of word lines and between which the gaps are reduced as well. As such, issues of polysilicon stringer may occur when word lines are manufactured by etching processes. That is, the word lines may be short-circuited due to the residual polysilicon between the word lines, caused by an incomplete etching between the word lines, resulting in lower reliability of the memory devices.

Accordingly, it is desirable to develop memory devices with improved reliability.

SUMMARY

The disclosure relates in general to a semiconductor element and a manufacturing method thereof. In the semiconductor element, the conductive damascene structures are formed by a damascene process, such that the uniformity of the widths of the conductive damascene structures are increased, a good insulation between the conductive damascene structures is achieved, the probability of short-circuits between word lines is reduced, and the reliability, operational efficiency and production yields of memory devices can be improved.

According to an embodiment of the disclosure, a semiconductor element is provided. The semiconductor element includes a substrate, a plurality of doping strips, a memory material layer, a plurality of conductive damascene structures, and a dielectric structure. The doping strips are formed in the substrate. The memory material layer is formed on the substrate, and the memory material layer comprises a memory area located on two sides of the doping strips. The conductive damascene structures are formed on the memory material layer. The dielectric structure is formed on the doping strips and between the conductive damascene structures. The conductive damascene structures are extended in a direction perpendicular to a direction which the doping strips are extended in.

According to another embodiment of the disclosure, a manufacturing method of a semiconductor element is provided. The manufacturing method of the semiconductor element includes the following steps. A substrate is provided. A plurality of doping strips are formed in the substrate. A memory material layer is formed on the substrate, and the memory material layer comprises a memory area located on two sides of the doping strips. A plurality of conductive damascene structures are formed on the memory material layer. A dielectric structure is formed on the doping strips and between the conductive damascene structures, wherein the conductive damascene structures are extended in a direction perpendicular to a direction which the doping strips are extended in.

The above and other aspects of the disclosure will become better understood with regard to the following detailed description of the non-limiting embodiment(s). The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

First Embodiment

Figure 1:
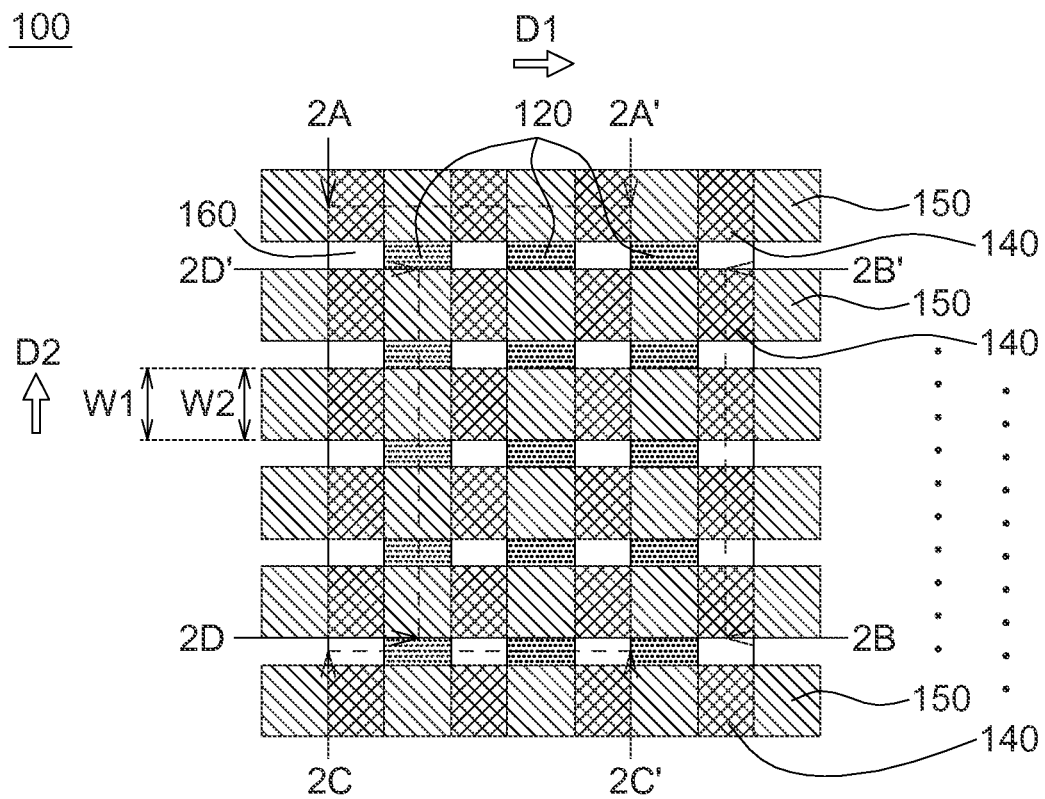
FIG. 1 shows a top view of a semiconductor element according to the first embodiment of the present disclosure.
Figure 2A:
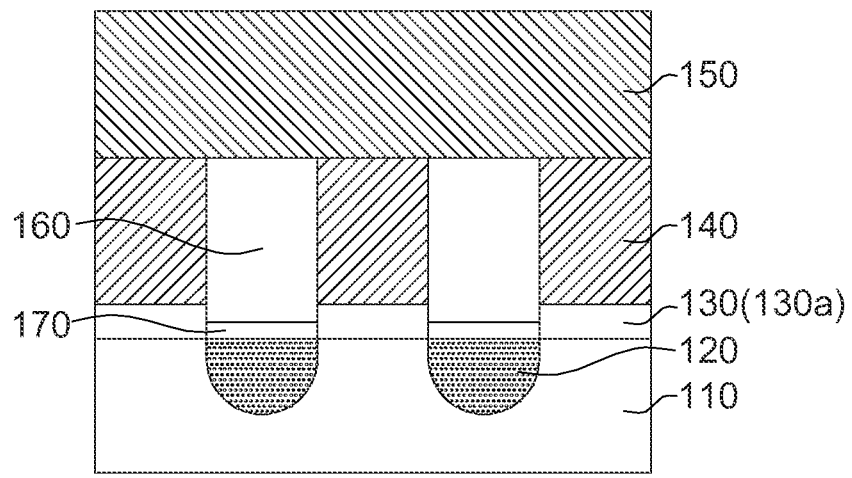
FIG. 2A shows a cross-sectional view along the section line 2A-2A' in FIG. 1.
Figure 2B:
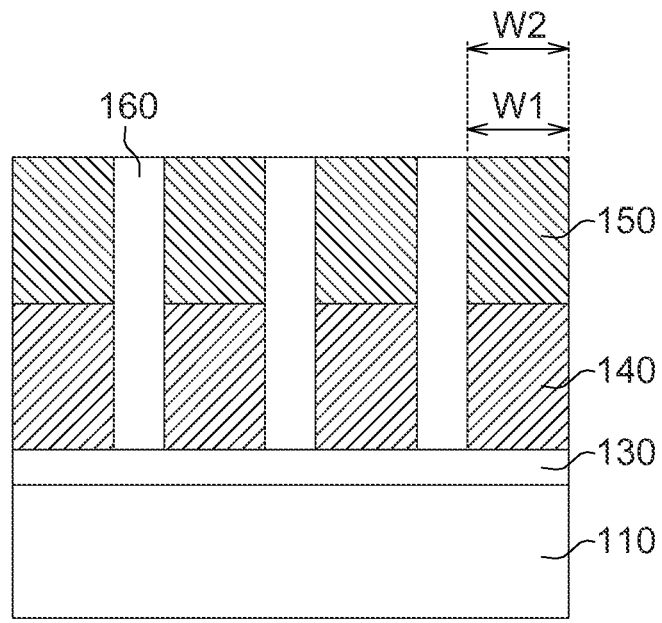
FIG. 2B shows a cross-sectional view along the section line 2B-2B' in FIG. 1.
Figure 2C:
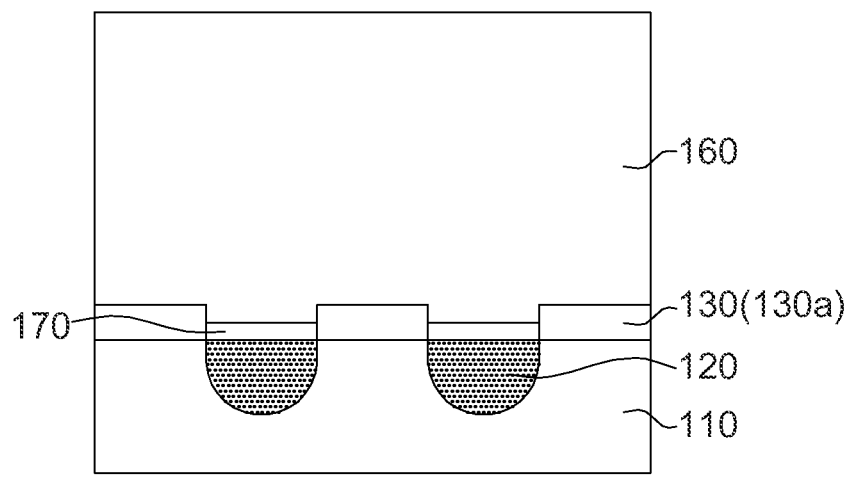
FIG. 2C shows a cross-sectional view along the section line 2C-2C' in FIG. 1.
Figure 2D:
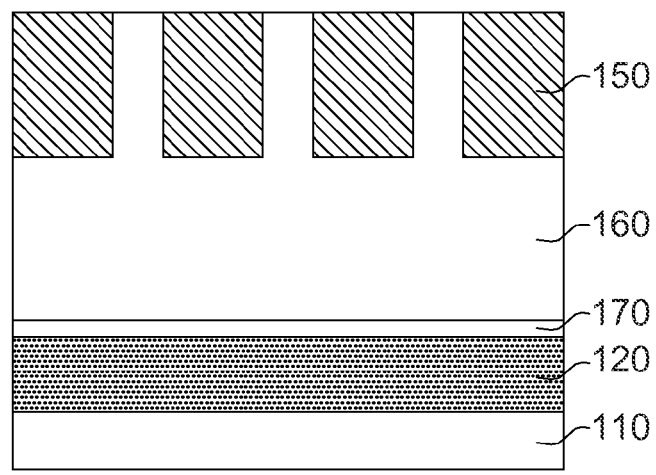
FIG. 2D shows a cross-sectional view along the section line 2D-2D' in FIG. 1.

FIG. 1 shows a top view of a semiconductor element 100 according to the first embodiment of the present disclosure, FIG. 2A shows a cross-sectional view along the section line 2A-2A' in FIG. 1, FIG. 2B shows a cross-sectional view along the section line 2B-2B' in FIG. 1, FIG. 2C shows a cross-sectional view along the section line 2C-2C' in FIG. 1, and FIG. 2D shows a cross-sectional view along the section line 2D-2D' in FIG. 1.

Referring to FIGS. 1 and 2A-2D, the semiconductor element 100 comprises a substrate 110, a plurality of doping strips 120, a memory material layer 130, a plurality of conductive damascene structures 150, and a dielectric structure 160. The doping strips 120 are formed in the substrate 110. The memory material layer 130 is formed on the substrate 110, and the memory material layer 130 comprises a memory area 130a located on two sides of the doping strips 120. The conductive damascene structures 150 are formed on the memory material layer 130. The dielectric structure 160 is formed on the doping strips 120 and located between the conductive damascene structures 150. The conductive damascene structures 150 are extended in a direction D1 perpendicular to a direction D2 which the doping strips are extended in.

In the embodiment, the semiconductor element 100 may further comprise a plurality of conductive layers 140 formed between the conductive damascene structures 150 and the memory material layer 130. As shown in FIGS. 1 and 2A-2D, the conductive layers 140 are formed on the memory material layer 130, and each of the conductive damascene structures 150 is formed on the corresponding conductive layer 140.

In the embodiment, the material of the substrate 110 is such as P type silicon or N type silicon, and the doping strips 120 are such as N type doping region (N+) or P type doping region (P+). The material for forming the doping strips 120 is such as As, $BF_2^+$, or P. In one embodiment, the semiconductor element is such as a memory device, and the doping strips 120 are bit lines.

In the embodiment, the memory material layer 130 may have a multi-layer structure, for example, which may be ONO composite layers, ONONO composite layers, or BE-SONOS composite layers, or comprise, for example, an ONO structure formed by alternately stacking silicon oxide and silicon nitride. The memory material layer 130 may be a single material layer as well, which comprises silicon nitride or silicon oxide, such as silicon dioxide or silicon oxynitride. The memory material layer 130 is used for electron trapping.

In the embodiment, as shown in FIGS. 1 and 2A-2B, each of the conductive damascene structures 150 is formed on and in direct contact with the corresponding conductive layer 140. The width W1 of the conductive damascene structures 150 is equal to the width W2 of the conductive layers 140. The conductive damascene structures 150 are electrically connected to the conductive layers 140. In the embodiment, the conductive layers 140 are formed of polysilicon or doped silicon, and the conductive damascene structures 150 are formed of a metallic material, such as tungsten.

In an embodiment, the semiconductor element 100 is such as a memory device, the conductive damascene structures 150 are the main body of the word lines, and a working voltage is applied through the conductive damascene structures 150 and the conductive layers 140. In comparison with the conventional etching process for manufacturing word lines, in the embodiment of the disclosure, each of the conductive damascene structure 150 (word line) is perfectly separated from one another by the dielectric structure 160, such that no residual conductive material remains between the conductive damascene structures 150 (word lines), and the conductive damascene structures 150 will not be short-circuited due to residual conductive materials left in between. As such, a good insulation between the conductive damascene structures 150 (word lines) is achieved, and hence the reliability of the memory device is improved. In addition, in the embodiment, the conductive damascene structures 150 are formed of a metallic material, of which the resistance is lower than that of a silicon-containing material; as such the operating performance of the memory device is improved.

In the embodiment, the material of the dielectric structure 160 is such as silicon oxide.

In the embodiment, as shown in FIGS. 2A and 2C, the semiconductor element 100 may further comprise a metal silicide layer 170. The material of the metal silicide layer 170 is such as CoSi. The metal silicide layer 170 is formed on the doping strips 120, reducing the resistance of the doping strips 120 (bit lines).

Second Embodiment

Figure 3:
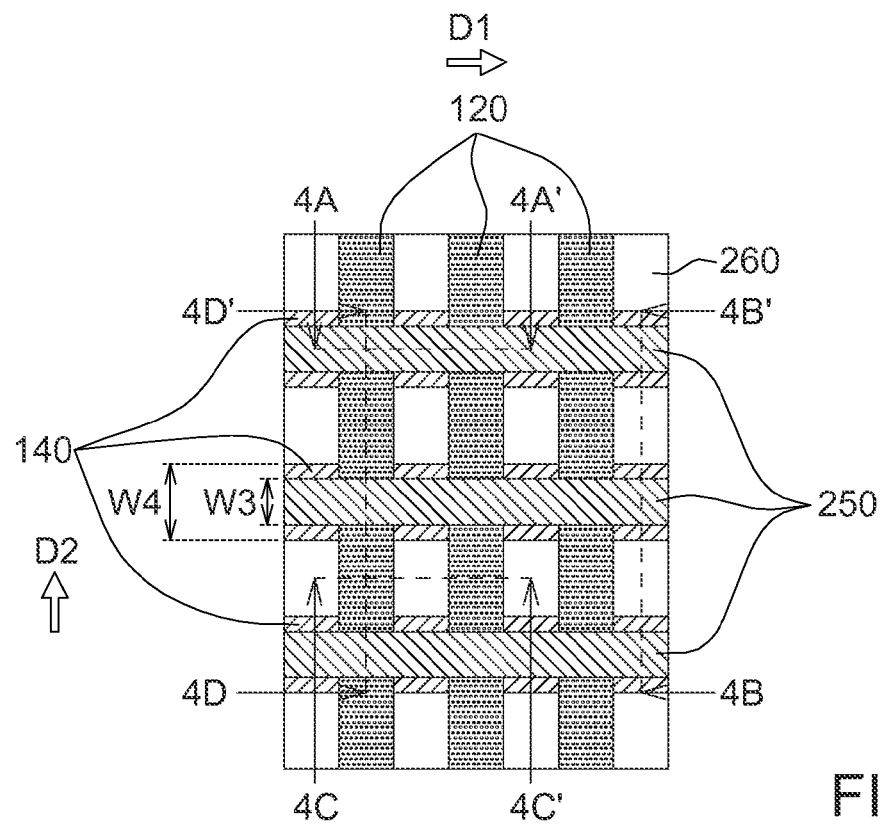
FIG. 3 shows a top view of a semiconductor element according to the second embodiment of the present disclosure.
Figure 4A:
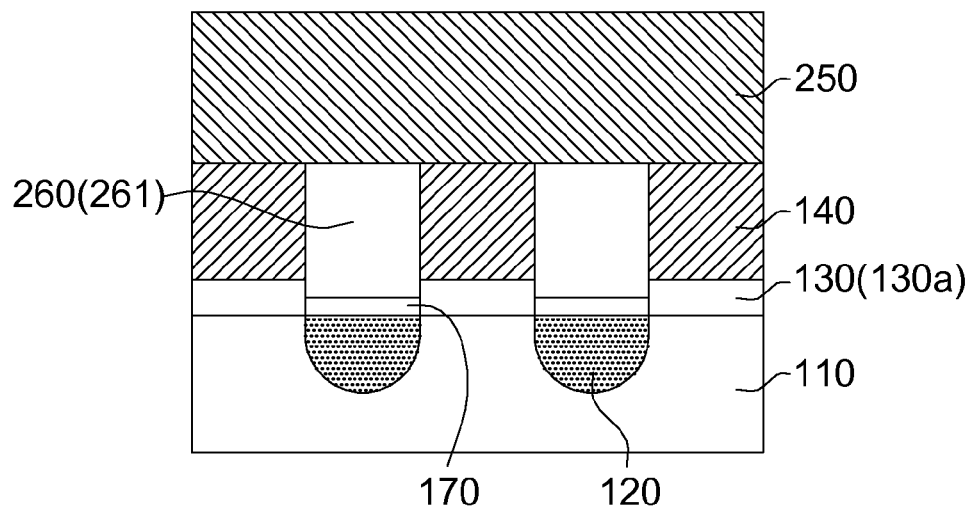
FIG. 4A shows a cross-sectional view along the section line 4A-4A' in FIG. 3.
Figure 4B:
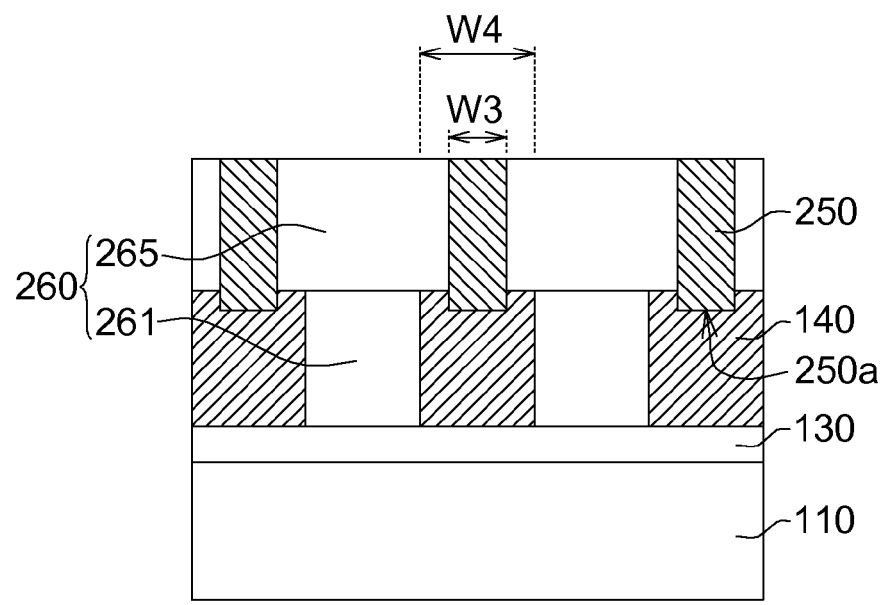
FIG. 4B shows a cross-sectional view along the section line 4B-4B' in FIG. 3.
Figure 4C:
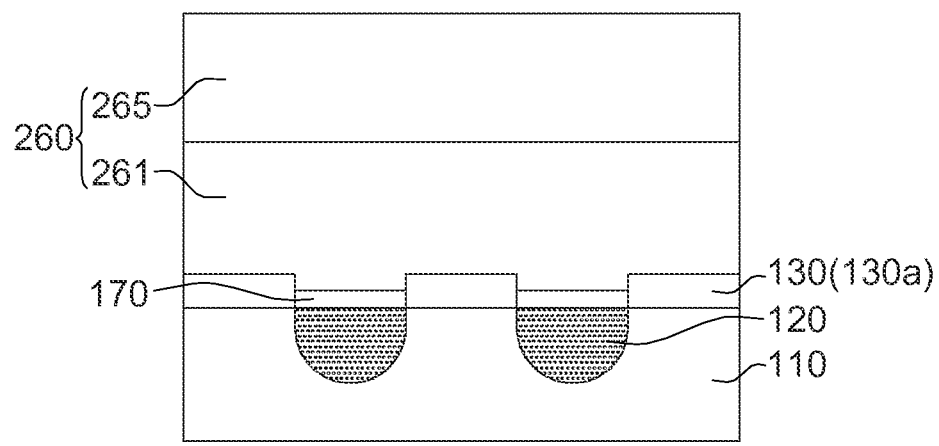
FIG. 4C shows a cross-sectional view along the section line 4C-4C' in FIG. 3.
Figure 4D:
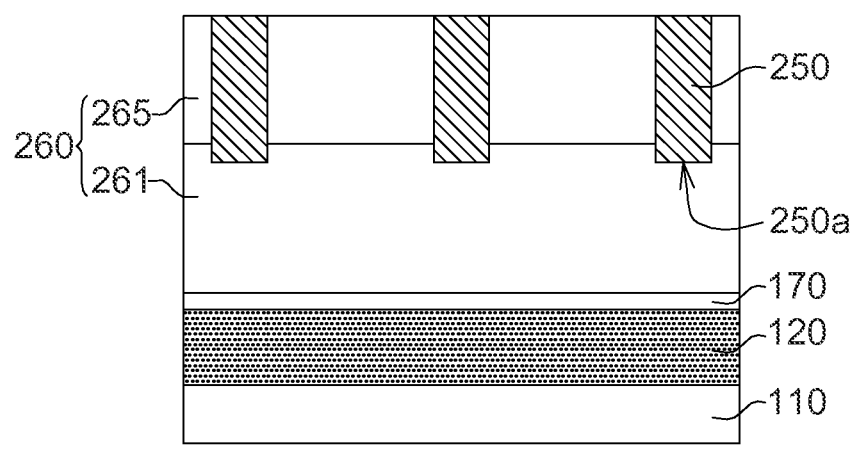
FIG. 4D shows a cross-sectional view along the section line 4D-4D' in FIG. 3.

FIG. 3 shows a top view of a semiconductor element 200 according to the second embodiment of the present disclosure, FIG. 4A shows a cross-sectional view along the section line 4A-4A' in FIG. 3, FIG. 4B shows a cross-sectional view along the section line 4B-4B' in FIG. 3, FIG. 4C shows a cross-sectional view along the section line 4C-4C' in FIG. 3, and FIG. 4D shows a cross-sectional view along the section line 4D-4D' in FIG. 3. The semiconductor element 200 of the present embodiment is different from the semiconductor element 100 of the first embodiment in the design of the conductive damascene structures 250 and the dielectric structure 260, and the similarities are not repeated here.

As shown in FIGS. 3 and 4A-4D, in the embodiment, the width W3 of the conductive damascene structures 250 is smaller than the width W4 of the conductive layers 140. As such, the distance between every two of the conductive damascene structures 250 is enlarged, which is advantageous to reducing the probability of short-circuits between the conductive damascene structures 250, and hence the reliability of the semiconductor element 200 is improved.

As shown in FIG. 4B, in the embodiment, an end 250a of the conductive damascene structures 250 is embedded in the conductive layers 140. As such, the overlaying error between the conductive damascene structures 250 and the conductive layer 140 can be reduced, which is advantageous to reducing the probability of short-circuits between the conductive damascene structures 250, and hence the reliability of the semiconductor element 200 is improved.

In one embodiment, as shown in FIGS. 4A-4D, the dielectric structure 260 may further comprise a dielectric layer 261 and a hard mask layer 265. The materials of the dielectric layer 261 and the hard mask layer 265 may be the same or different. The dielectric layer 261 separates each of the conductive layers 140 from one another, and the hard mask layer 265 separates each of the conductive damascene structures 250 from one another. In one embodiment, as shown in FIG. 4D, the end 250a of the conductive damascene structures 250 is embedded in the dielectric structure 260.

Third Embodiment

Figure 5:
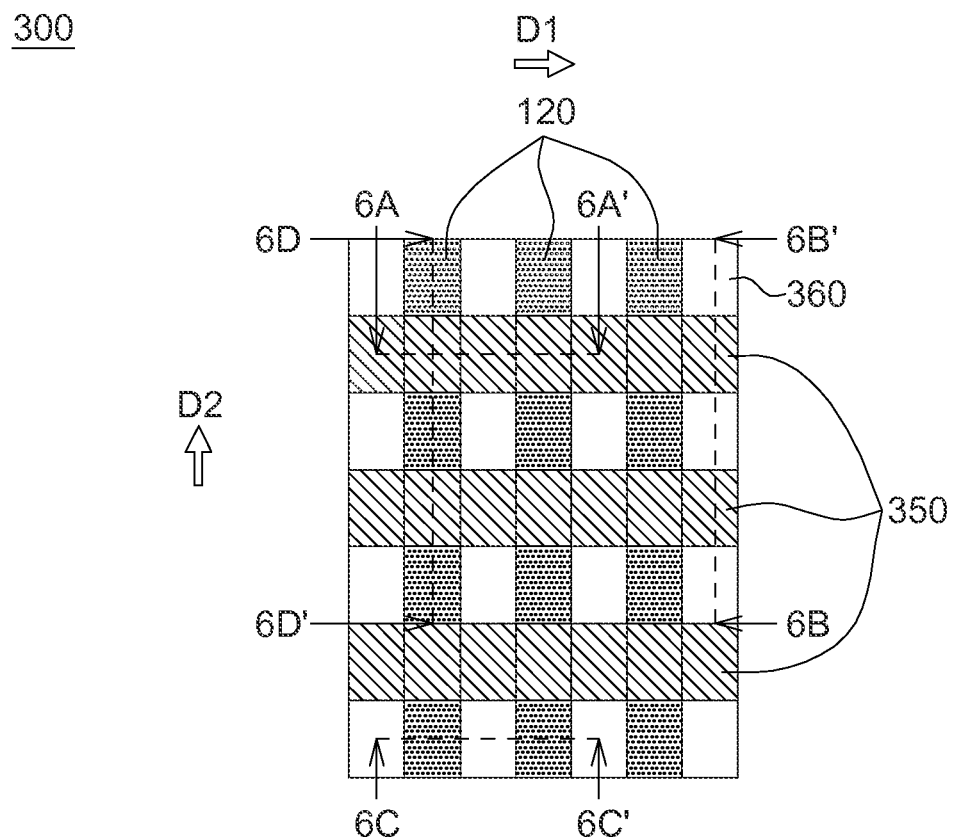
FIG. 5 shows a top view of a semiconductor element according to the third embodiment of the present disclosure.
Figure 6A:
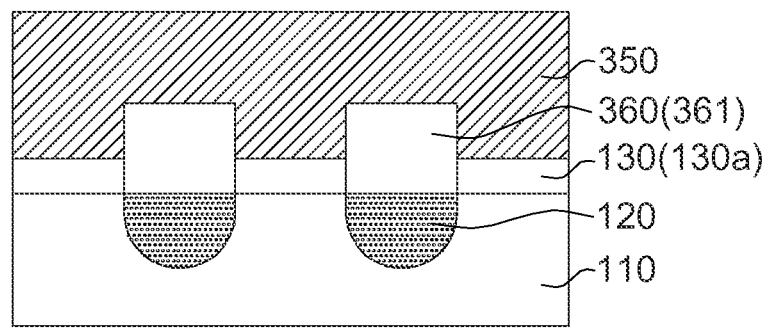
FIG. 6A shows a cross-sectional view along the section line 6A-6A' in FIG. 5.
Figure 6B:
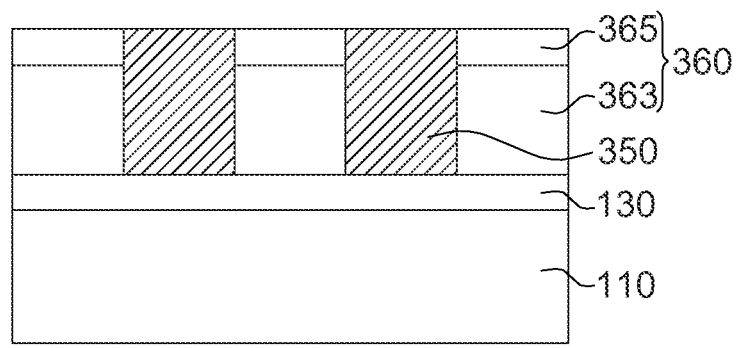
FIG. 6B shows a cross-sectional view along the section line 6B-6B' in FIG. 5.
Figure 6C:
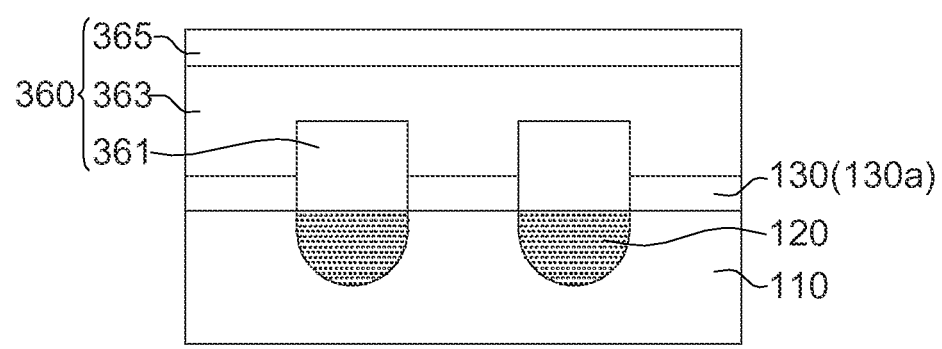
FIG. 6C shows a cross-sectional view along the section line 6C-6C' in FIG. 5.
Figure 6D:
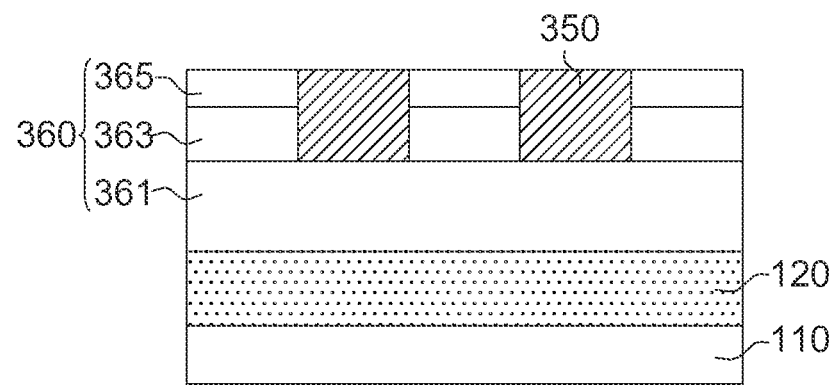
FIG. 6D shows a cross-sectional view along the section line 6D-6D' in FIG. 5.

FIG. 5 shows a top view of a semiconductor element 300 according to the second embodiment of the present disclosure, FIG. 6A shows a cross-sectional view along the section line 6A-6A' in FIG. 5, FIG. 6B shows a cross-sectional view along the section line 6B-6B' in FIG. 5, FIG. 6C shows a cross-sectional view along the section line 6C-6C' in FIG. 5, and FIG. 6D shows a cross-sectional view along the section line 6D-6D' in FIG. 5. The semiconductor element 300 of the present embodiment is different from the semiconductor element 100 of the first embodiment in the design of the conductive damascene structures 350 and the dielectric structure 360, and the similarities are not repeated here.

As shown in FIGS. 5 and 6A-6D, in the embodiment, the semiconductor element 300 comprises the substrate 110, the doping strips 120, the memory material layer 130, a plurality of conductive damascene structures 350, and a dielectric structure 360. The doping strips 120 are formed in the substrate 110. The memory material layer 130 is formed on the substrate 110, and the memory material layer 130 comprises a memory area 130a located on two sides of the doping strips 120. The conductive damascene structures 350 are formed on the memory material layer 130. The dielectric structure 360 comprises a first dielectric layer 361 and a second dielectric layer 363. The first dielectric layer 361 is formed on the doping strips 120; and the second dielectric layer 363 is formed on the first dielectric layer 361 and between the conductive damascene structures 350. The conductive damascene structures 350 are extended in the direction D1 perpendicular to the direction D2 which the doping strips are extended in, and the first dielectric layer 361 and the second dielectric layer 363 are formed from different materials.

In comparison with the semiconductor element 100 of the first embodiment, the semiconductor element 300 of the present embodiment does not include additional conductive layers for electrically connecting to the conductive damascene structures 350. In an embodiment, the semiconductor element 300 is such as a memory device, the conductive damascene structures 350 are the main body of the word lines, and a working voltage is applied through the conductive damascene structures 350. Each of the conductive damascene structure 350 (word line) is perfectly separated from one another by the dielectric structure 360, such that the conductive damascene structures 350 will not be short-circuited due to residual conductive materials left in between. As such, a good insulation between the conductive damascene structures 350 (word lines) is achieved, and hence the reliability of the memory device is improved.

In the embodiment, the material of the first dielectric layer 361 is such as a metal oxide, for example, silicon oxide, and the material of the second dielectric layer 363 is such as a metal nitride, for example, silicon nitride.

In one embodiment, the dielectric structure 360 of the semiconductor element 300 may further comprise a hard mask layer 365. The hard mask layer 365 is formed on the second dielectric layer 363, and the hard mask layer 365 and the second dielectric layer 363 are formed from different materials. In the embodiment, the material of the hard mask layer 365 is such as a metal oxide, for example, silicon oxide. In the embodiment, the hard mask layer 365 and the first dielectric layer 361 are formed from such as the same material(s).

In the embodiment, the conductive damascene structures 350 are such as formed of polysilicon.

In the embodiment, the semiconductor element 300 may further comprise a metal silicide layer (not shown), of which the material is such as CoSi. The metal silicide layer is formed on the doping strips 120, reducing the resistance of the doping strips 120 (bit lines).

The embodiments disclosed below are for elaborating a manufacturing method of the semiconductor element of the disclosure. However, the descriptions disclosed in the embodiments of the disclosure such as detailed manufacturing procedures are for illustration only, not for limiting the scope of protection of the disclosure. People having ordinary skills in the art may modify or change the steps disclosed in the embodiments according actual needs. It is noted that some of the components are drawn with dashed lines or in a perspective fashion in the top view figures for further elaborating the present disclosure.

Referring to FIGS. 1, 2A-2D, and 7-20D, FIGS. 7-20D illustrate a process for manufacturing a semiconductor element according to the first embodiment of the present disclosure.

Figure 7:
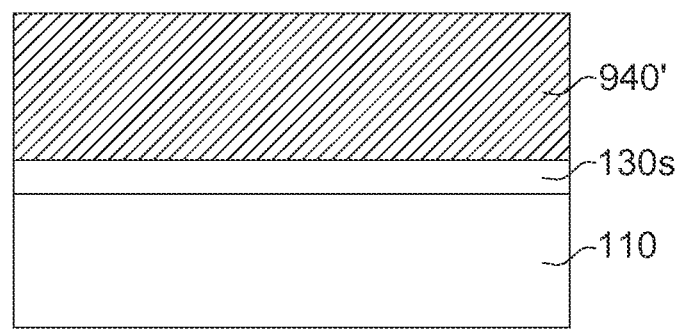
FIGS. 7-20D illustrate a process for manufacturing a semiconductor element according to the first embodiment of the present disclosure.
Figure 8:
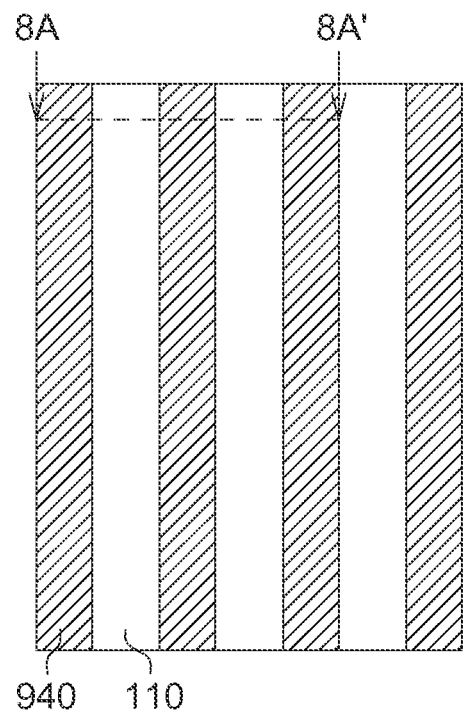
Figure 9:
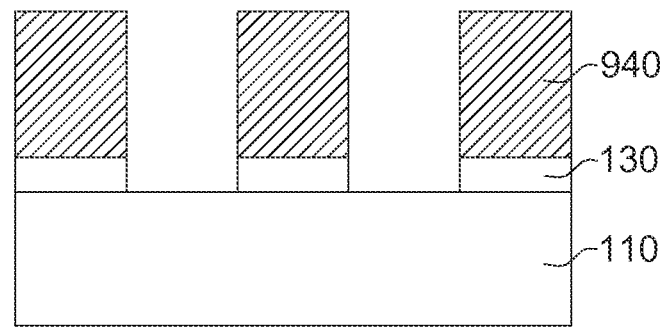
Figure 10A:
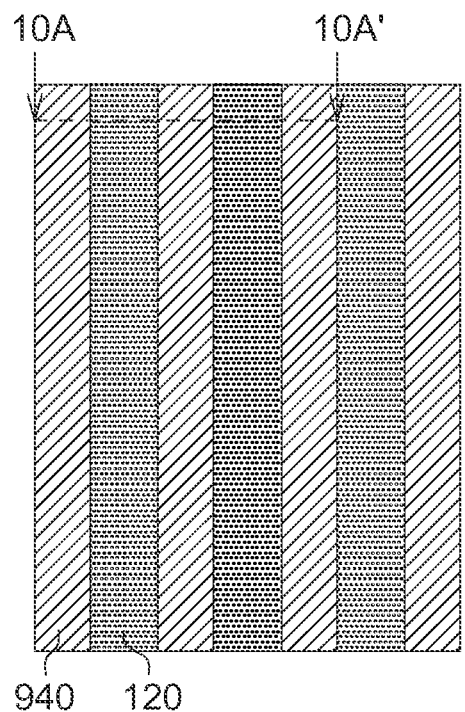
Figure 10B:
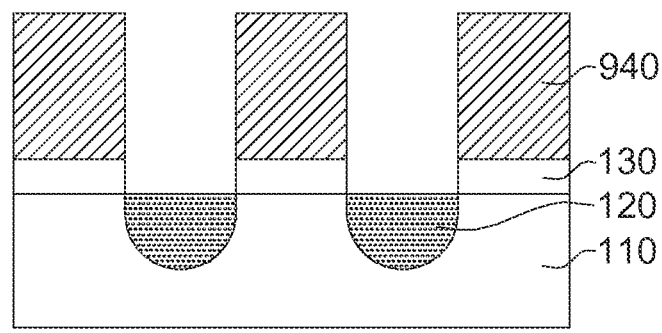

As shown in FIGS. 7-10B (FIG. 9 shows a cross-sectional view along the section line 8A-8A' in FIG. 8, and FIG. 10B shows a cross-sectional view along the section line 10A-10A' in FIG. 10), the substrate 110 is provided, the doping strips 120 are formed in the substrate 110, and the memory material layer 130 is formed on the substrate 110, the memory material layer 130 comprising a memory area 130a located on two sides of the doping strips 120.

In the embodiment, the manufacturing method of providing the substrate 110 and forming the doping strips 120 and the memory material layer 130 comprises, for example, the following steps. As shown in FIG. 7, a memory material coating 130s is formed on the substrate 110, and a conductive material layer 940' is formed on the memory material coating 130s. And then, as shown in FIGS. 8-9, the conductive material layer 940' and the memory material coating 130s are partially removed to form strip-shaped conductive material layers 940 and the memory material layer 130. In the embodiment, the conductive material layer 940' and the memory material coating 130s are partially removed by such as an etching process or a solvent lift-off process. And then, as shown in FIGS. 10A-10B, an ion implantation is performed on the portion of the substrate 110 uncovered by the memory material layer 130 for forming the doping strips 120. The locations and properties of bit lines are defined in this step.

Figure 11A:
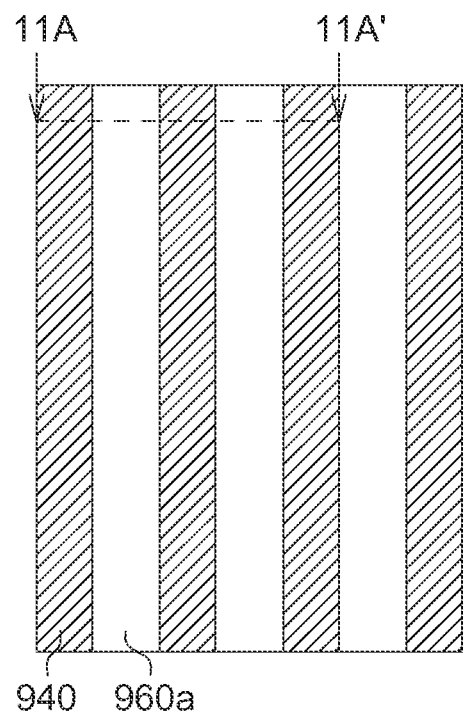
Figure 11B:
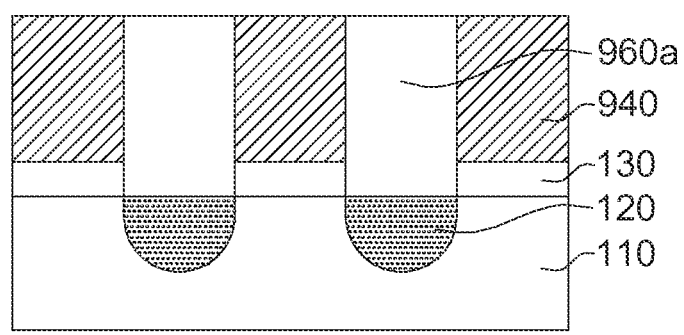
Figure 12A:
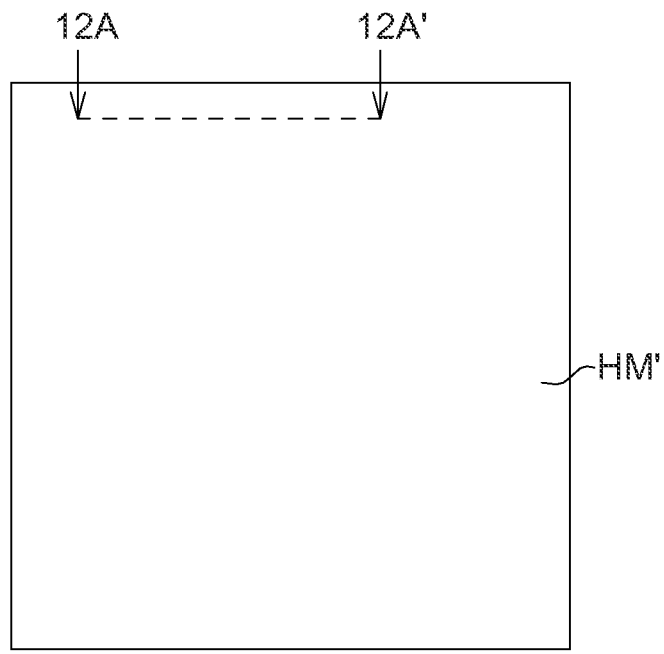
Figure 12B:
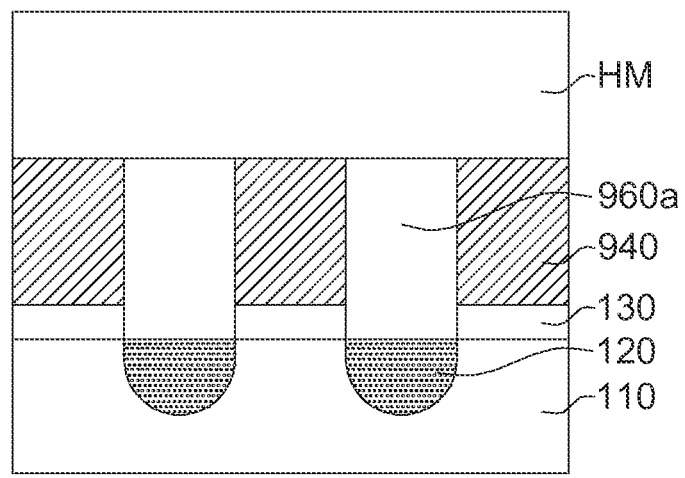
Figure 13:
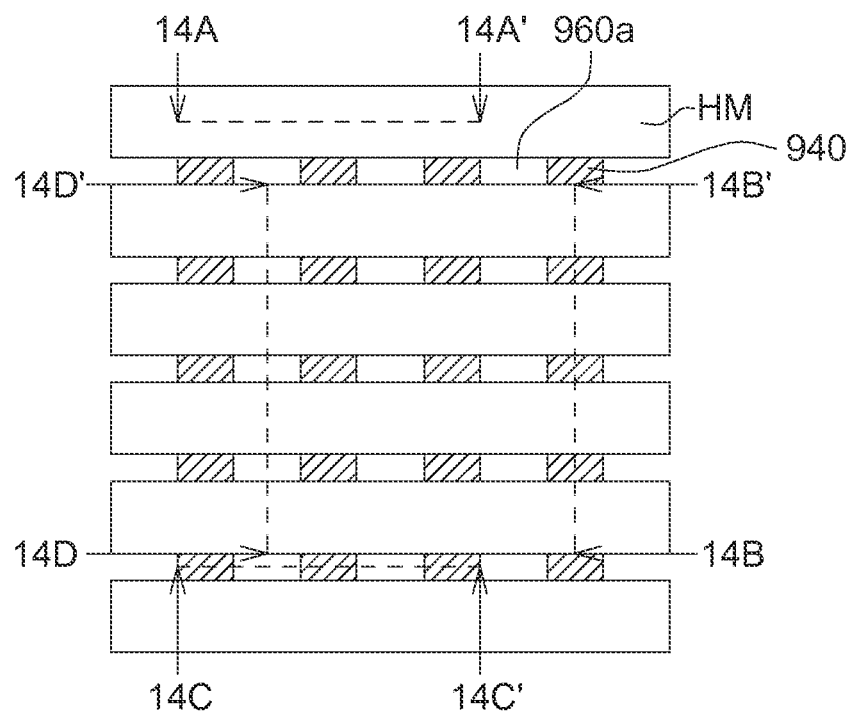
Figure 14A:
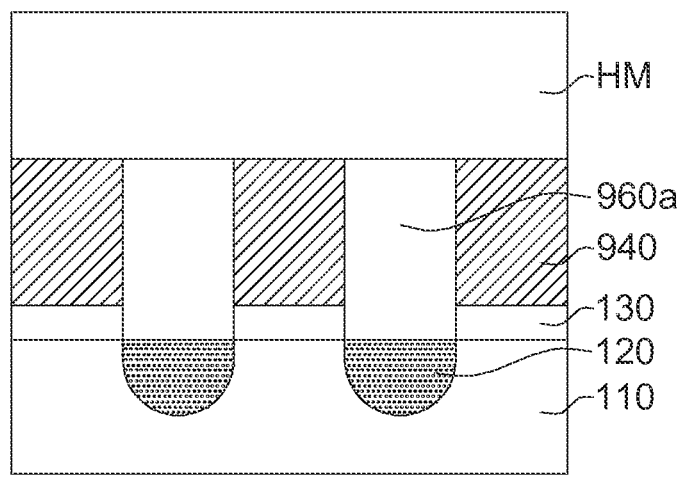
Figure 14B:
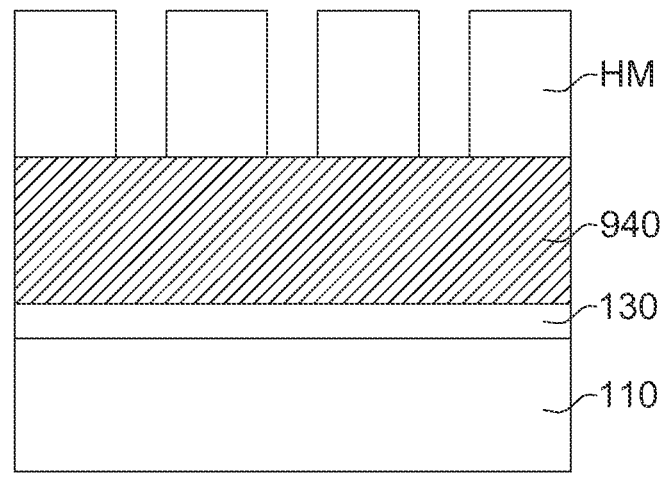
Figure 14C:
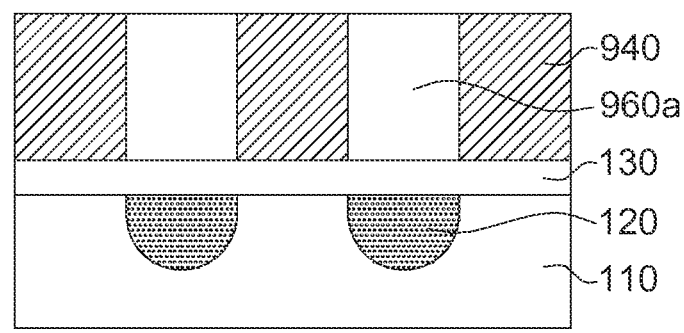
Figure 14D:
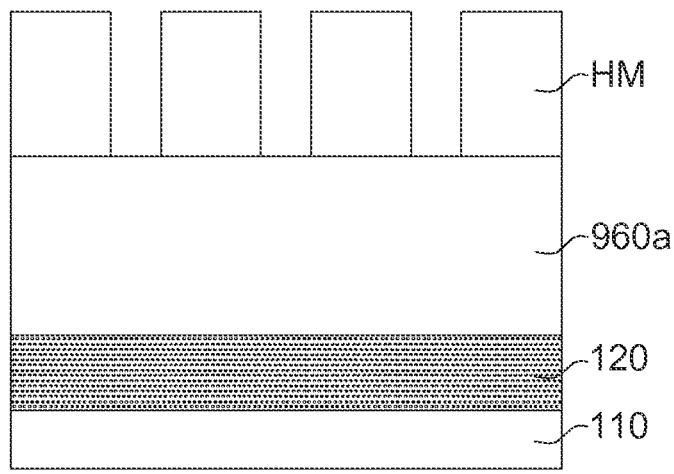
Figure 15:
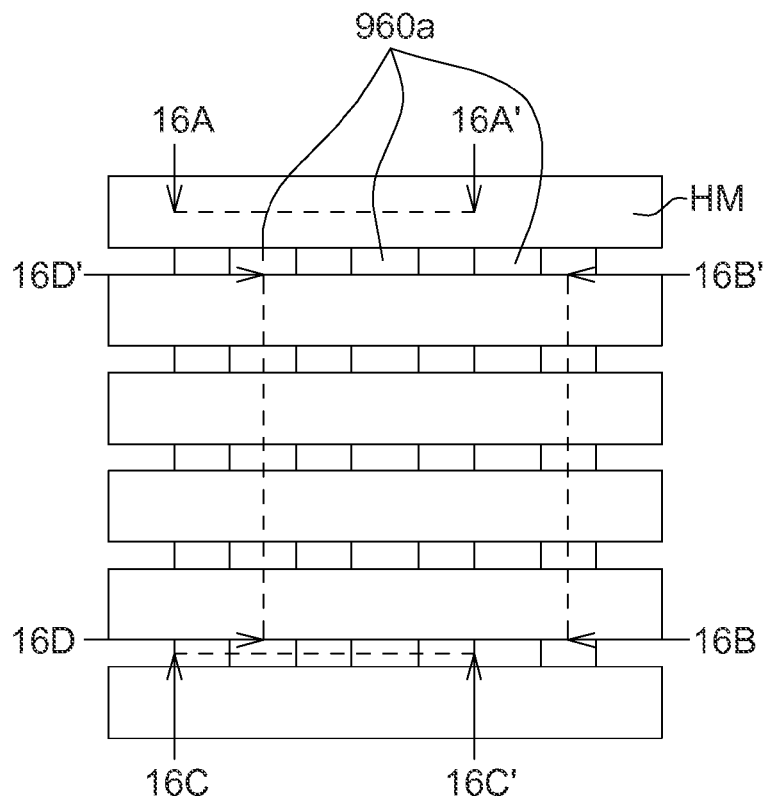
Figure 16A:
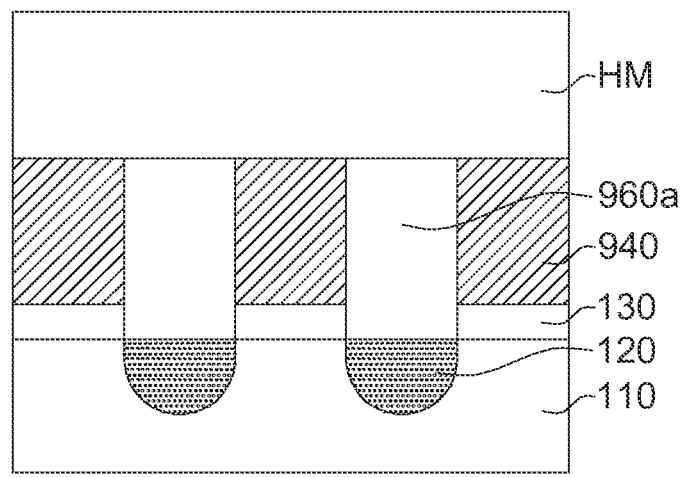
Figure 16B:
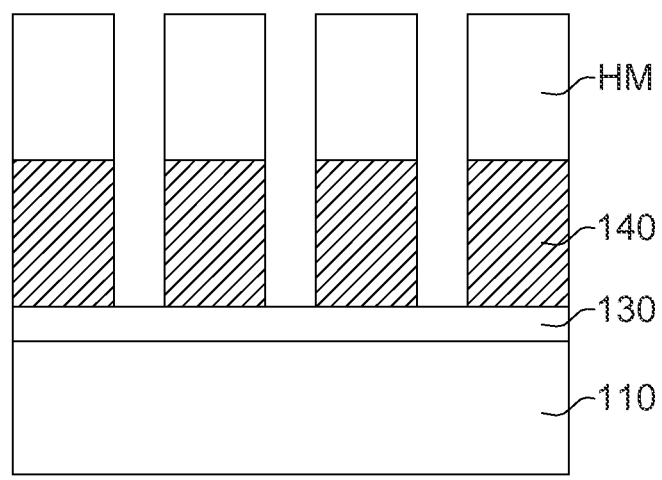
Figure 16C:
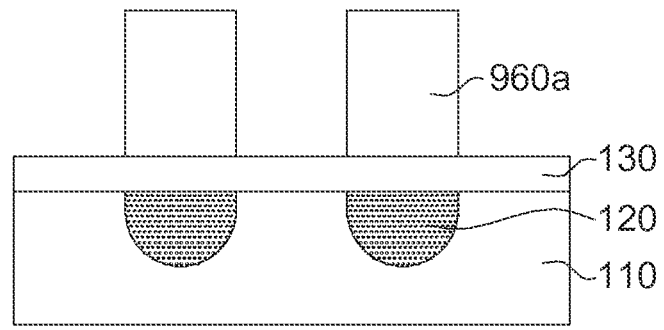
Figure 16D:
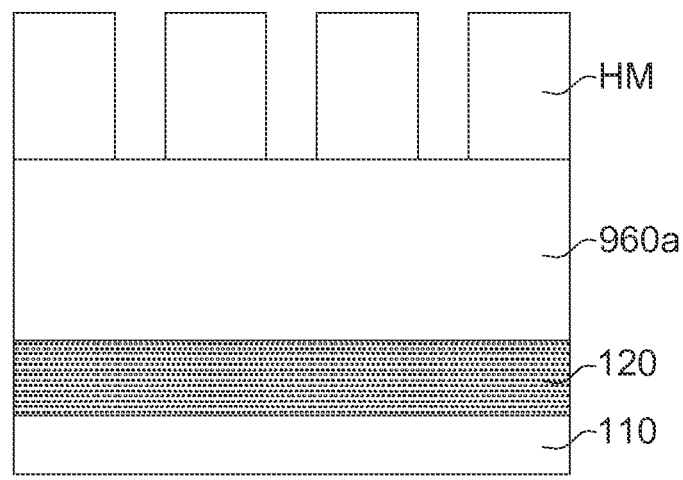
Figure 17:
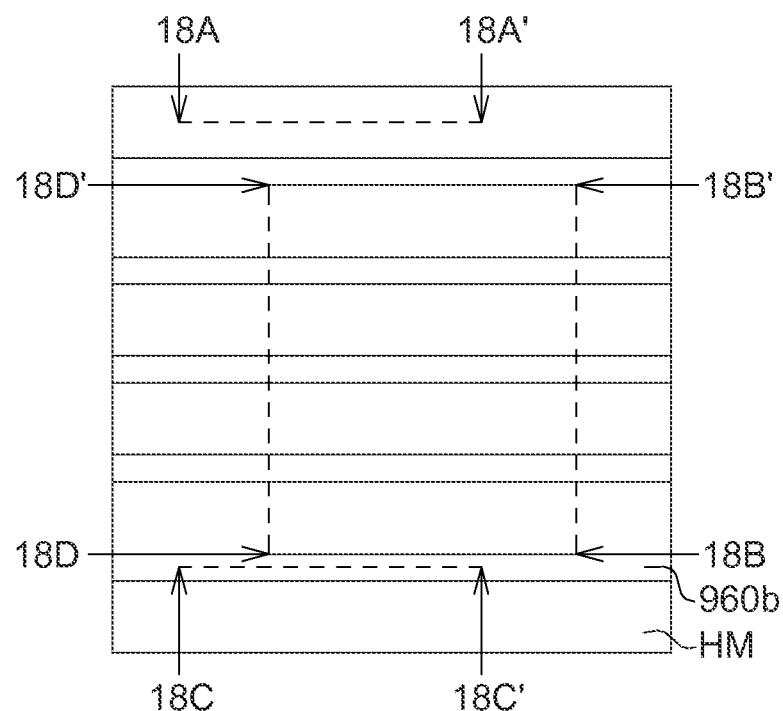
Figure 18A:
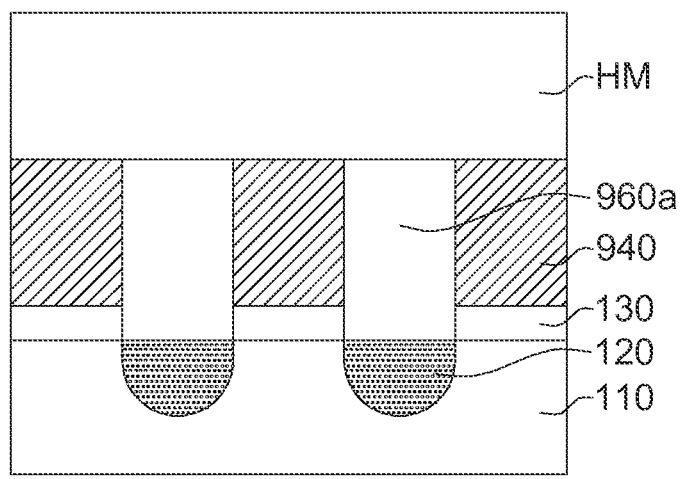
Figure 18B:
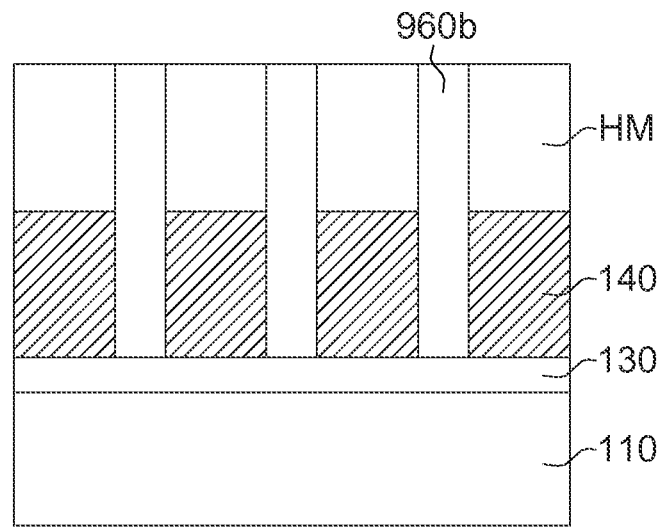
Figure 18C:
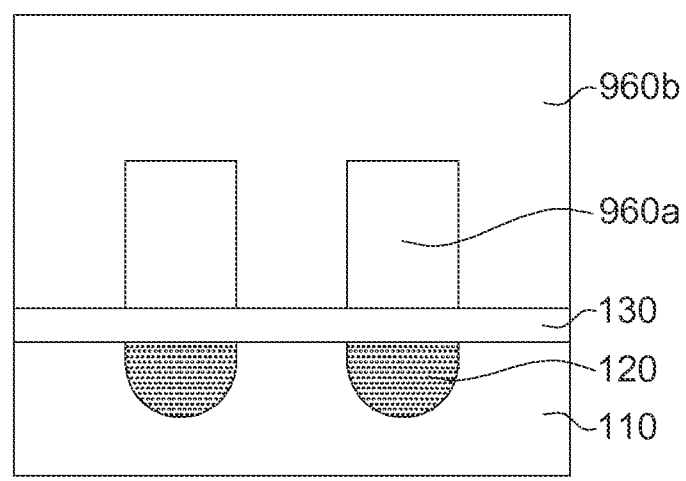
Figure 18D:
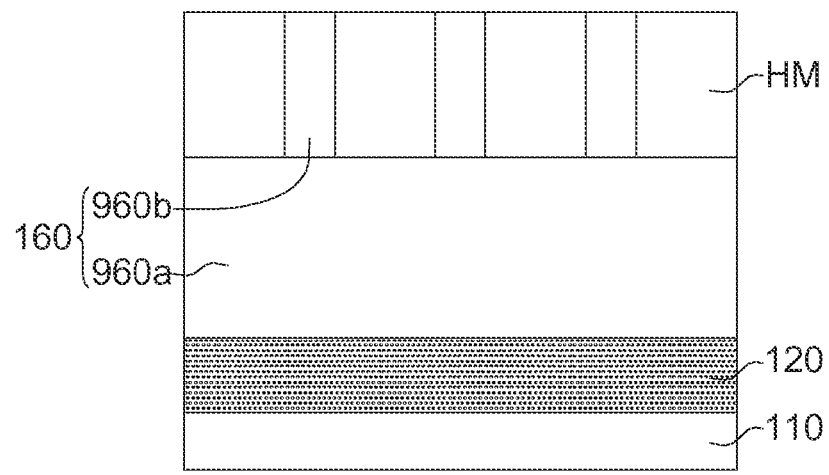
Figure 19:
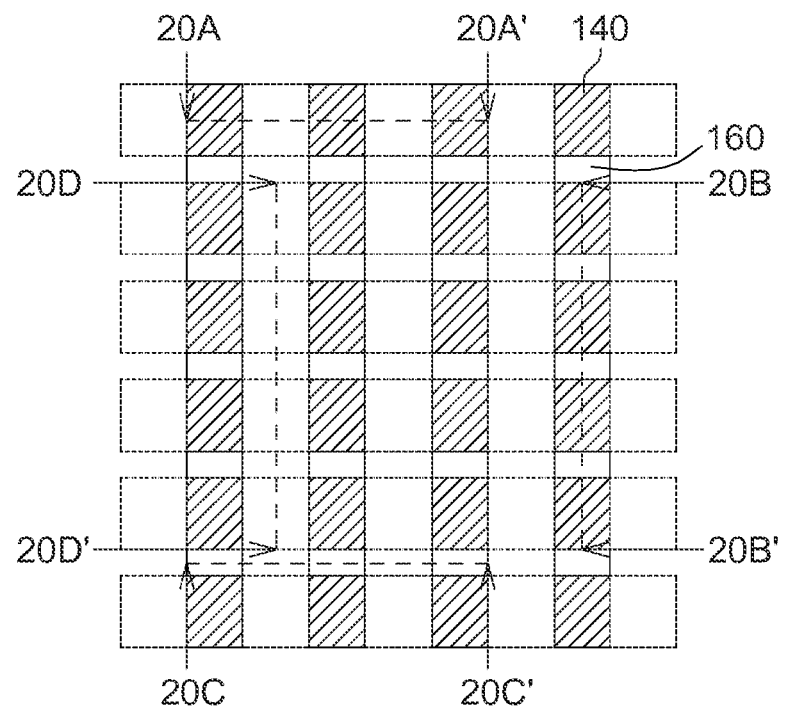
Figure 20A:
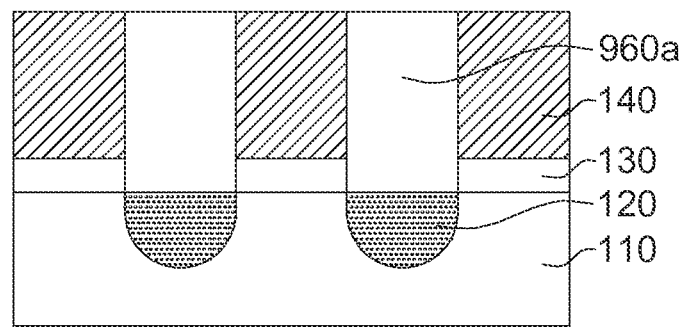
Figure 20B:
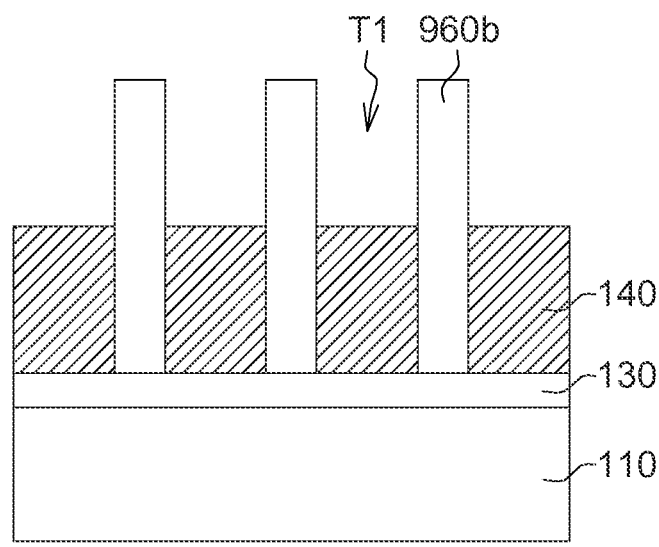
Figure 20C:
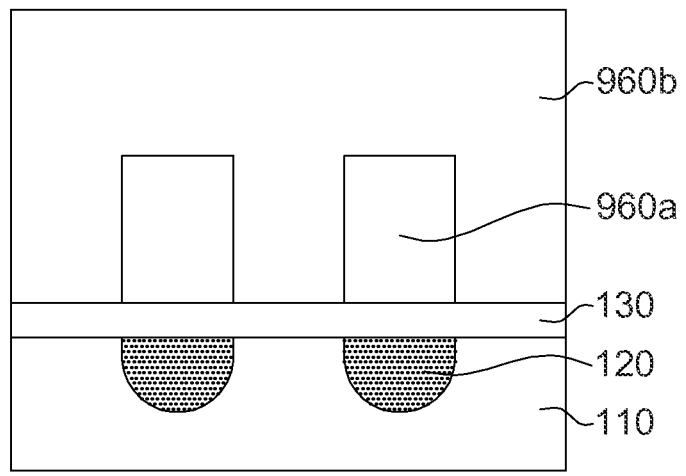
Figure 20D:
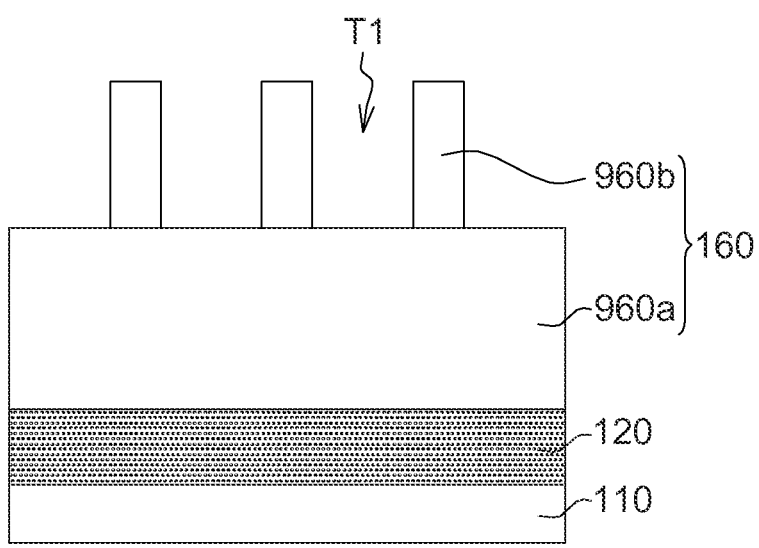

Next, referring to FIGS. 11A-20D (FIG. 11B shows a cross-sectional view along the section line 11A-11A' in FIG. 11B, FIG. 12B shows a cross-sectional view along the section line 12A-12A' in FIG. 12A, FIG. 14A shows a cross-sectional view along the section line 14A-14A' in FIG. 13, FIG. 14B shows a cross-sectional view along the section line 14B-14B' in FIG. 13, FIG. 14C shows a cross-sectional view along the section line 14C-14C' in FIG. 13, FIG. 14D shows a cross-sectional view along the section line 14D-14D' in FIG. 13, FIG. 16A shows a cross-sectional view along the section line 16A-16A' in FIG. 15, FIG. 16B shows a cross-sectional view along the section line 16B-16B' in FIG. 15, FIG. 16C shows a cross-sectional view along the section line 16C-16C' in FIG. 15, FIG. 16D shows a cross-sectional view along the section line 16D-16D' in FIG. 15, FIG. 18A shows a cross-sectional view along the section line 18A-18A' in FIG. 17, FIG. 18B shows a cross-sectional view along the section line 18B-18B' in FIG. 17, FIG. 18C shows a cross-sectional view along the section line 18C-18C' in FIG. 17, FIG. 18D shows a cross-sectional view along the section line 18D-18D' in FIG. 17, FIG. 20A shows a cross-sectional view along the section line 20A-20A' in FIG. 19, FIG. 20B shows a cross-sectional view along the section line 20B-20B' in FIG. 19, FIG. 20C shows a cross-sectional view along the section line 20C-20C' in FIG. 19, and FIG. 20D shows a cross-sectional view along the section line 20D-20D' in FIG. 19), the conductive damascene structures 150 are formed on the memory material layer 130, and the dielectric structure 160 is formed on the doping strips 120.

In the embodiment, the manufacturing method of forming the dielectric structure 160 comprises, for example, the following steps. As shown in FIGS. 11A-11B, a dielectric material layer 960a is deposited on the substrate 110 and between the strip-shaped conductive material layers 940, and then the top surfaces of the dielectric material layer 960a and the conductive material layers 940 are planarized. In the embodiment, the material of the dielectric material layer 960a is such as silicon oxide, and the planarization is performed by such as a chemical mechanical polishing (CMP) process.

And then, as shown in FIGS. 12A-12B, a hard mask layer HM is deposited on the top surfaces of the dielectric material layer 960a and the conductive material layers 940. The material of the hard mask layer HM is such as silicon nitride. And then, as shown in FIGS. 13 and 14A-14B, the hard mask layer HM is patterned to form a patterned hard mask layer HM' for partially exposing the top surfaces of the dielectric material layer 960a and the conductive material layers 940. In the embodiment, the hard mask layer HM is patterned by such as an etching process to form the patterned hard mask layer HM' having a plurality of trenches.

And then, as shown in FIGS. 15 and 16A-16D, the conductive material layers 940 are etched according to the patterned hard mask layer HM' to form the conductive layers 140 on the memory material layer 130. The trenches of the patterned hard mask layer HM' extend to the conductive layers 140, exposing the memory material layer 130. In an alternative embodiment, the memory material layer 130 may be etched as well in this step (not shown). And then, as shown in FIGS. 17 and 18A-18D, a dielectric material layer 960b is deposited in the trenches of the patterned hard mask layer HM' and in the trenches between the conductive layers 140. And then, as shown in FIGS. 19 and 20A-20D, the patterned hard mask layer HM' is removed for forming a plurality of trenches T1 in the dielectric material layer 960a and the dielectric material layer 960b. At present, the dielectric material layer 960a and the dielectric material layer 960b form the dielectric structure 160. The dielectric structure 160 has a plurality of trenches T1, and the trenches T1 are extended in the direction D1 perpendicular to the direction D2 which the doping strips 120 are extended in.

Next, referring to FIGS. 1 and 2A-2D, a conductive material is filled in the trenches T1 for forming the conductive damascene structures 150 on the conductive layers 140. As such, the semiconductor element 100 as shown in FIGS. 1 and 2A-2D is formed.

In an embodiment, a metal silicide layer 170 may be further formed on the substrate 110 (on the doping strips 120) either before or after the doping strips 120 are formed. In the embodiment, the conductive damascene structures 150 are formed of a metallic material, of which the manufacturing process is not performed on a machine which is specifically for manufacturing silicon-containing materials. Therefore, in the present embodiment, the machine for manufacturing silicon-containing materials is not utilized and therefore not contaminated by the step of forming the metal silicide layer 170, and hence the convenience of the whole manufacturing process is increased.

In comparison with the conventional etching process for manufacturing the whole conductive contact structures (word lines), in the embodiments of the present disclosure, the conductive damascene structures 150 are formed by a damascene process, such that the variation of the widths of the conductive damascene structures 150 is reduced, that is, the uniformity of the widths of the conductive damascene structures 150 is increased. Moreover, even the conductive layers 140 are formed by an etching process, since the etching depth for the conductive layers 140 is smaller than the etching depth for forming the whole conductive contact structure by the conventional etching process, the variation of the widths of the conductive layers 140 is reduced as well, reducing the variation of the widths of the whole conductive contact structures (the conductive damascene structures 150 in combination with the conductive layers 140). In an embodiment, the semiconductor element 100 is such as a memory device, and the conductive damascene structures 150 are such as the main body of the word lines. As the variation of the widths of the word lines is reduced, the reliability, operational efficiency and production yields of the memory device can be improved.

Referring to FIGS. 3-4D, 7-11B, and 21A-27D, FIGS. 21A-27D illustrate a process for manufacturing a semiconductor element according to the second embodiment of the present disclosure.

First, as shown in FIGS. 7-10B, the substrate 110 is provided, the doping strips 120 are formed in the substrate 110, and the memory material layer 130 is formed on the substrate 110, the memory material layer 130 comprising a memory area 130a located on two sides of the doping strips 120.

Figure 21A:
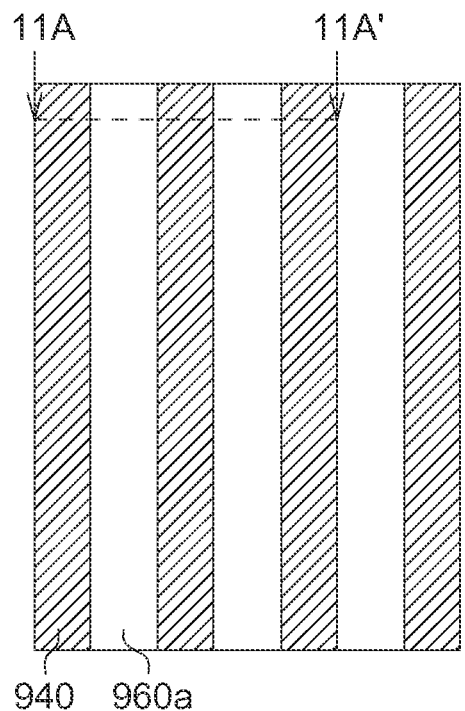
FIGS. 21A-27D illustrate a process for manufacturing a semiconductor element according to the second embodiment of the present disclosure.
Figure 21B:
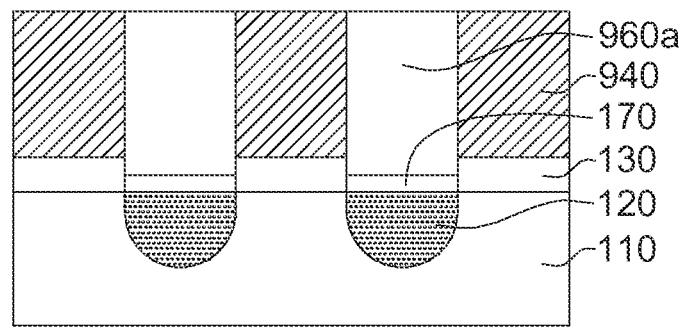
Figure 22A:
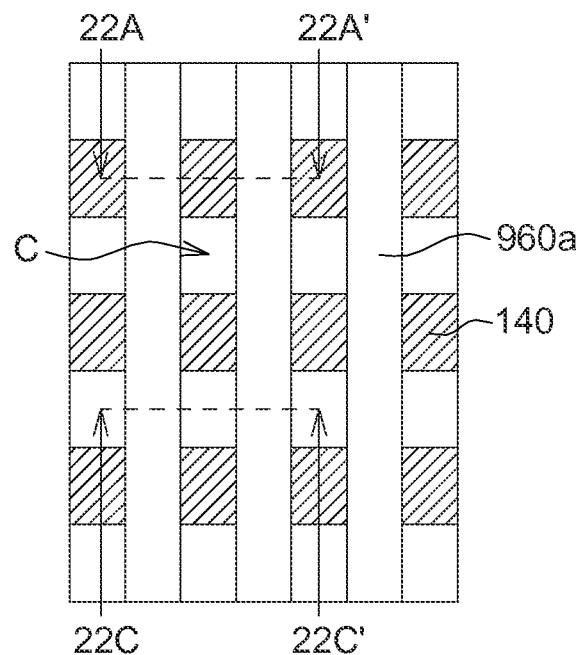
Figure 22B:
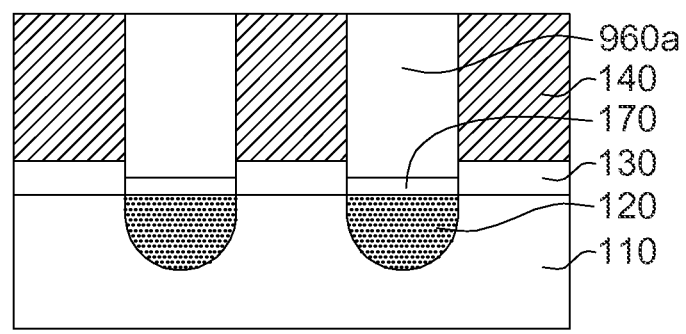
Figure 22C:
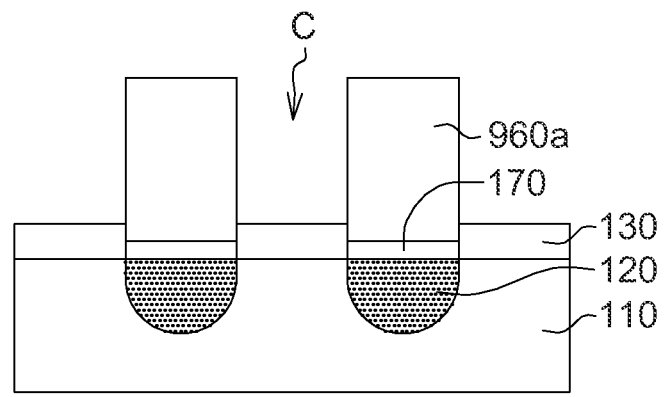
Figure 23A:
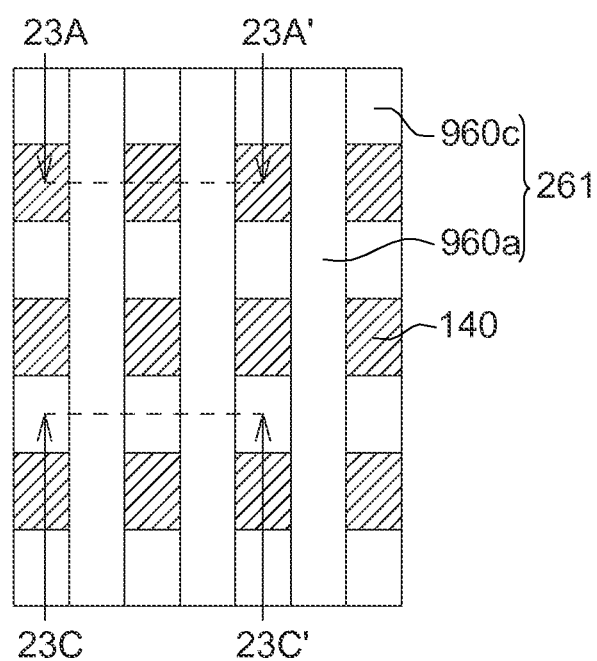
Figure 23B:
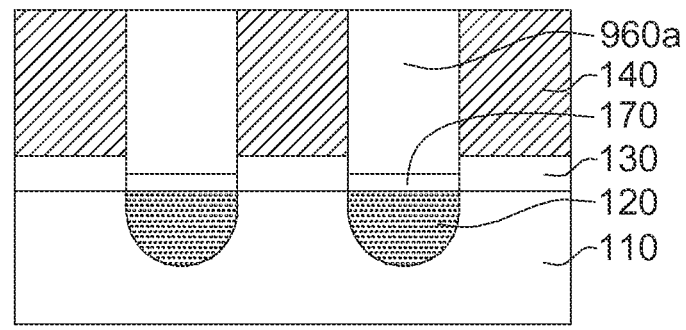
Figure 23C:
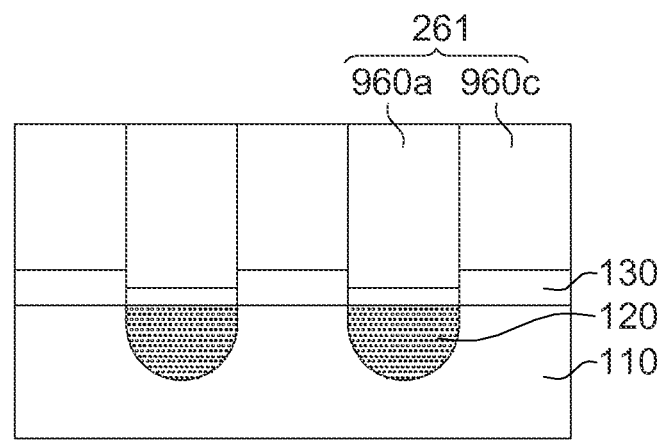
Figure 24:
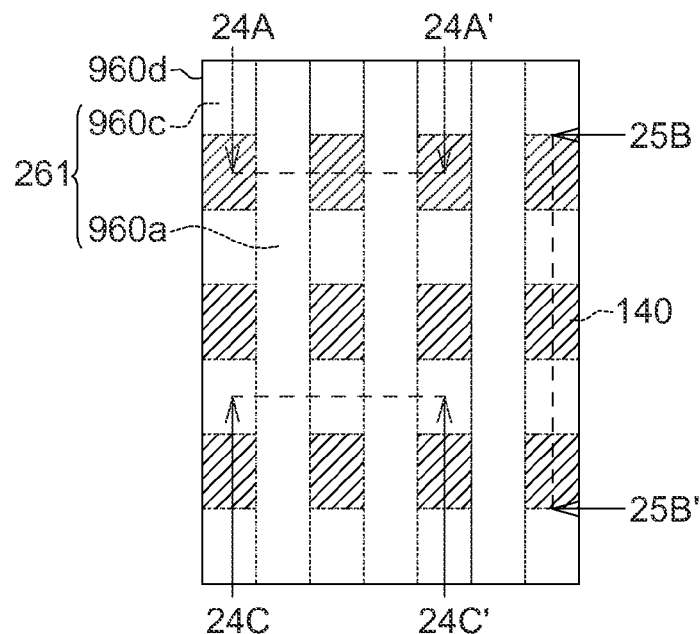
Figure 25A:
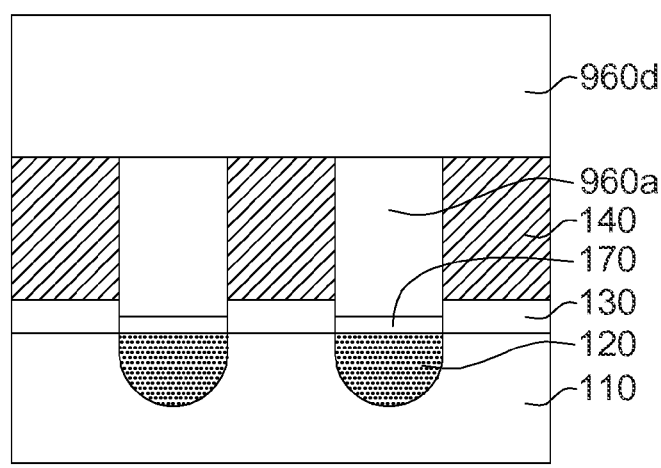
Figure 25B:
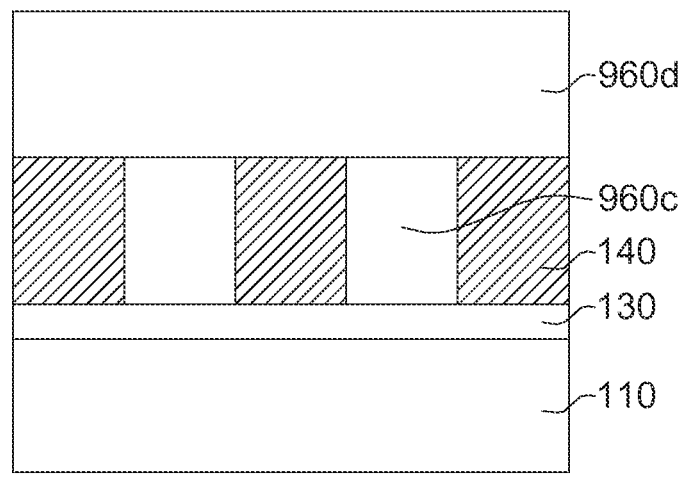
Figure 25C:
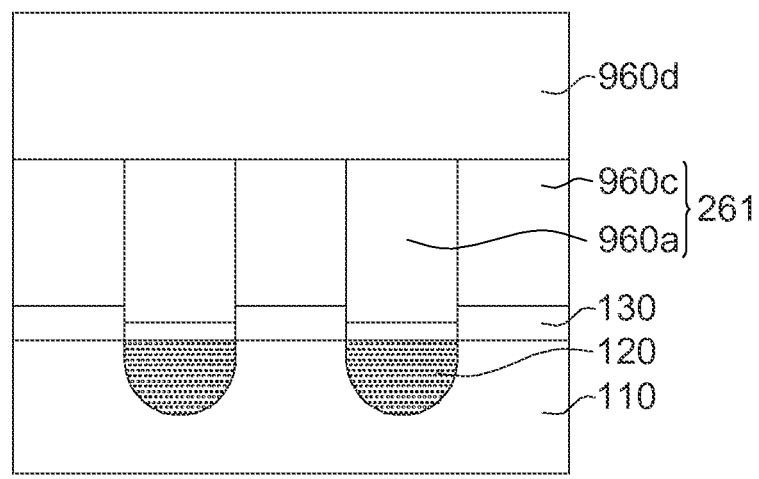
Figure 26:
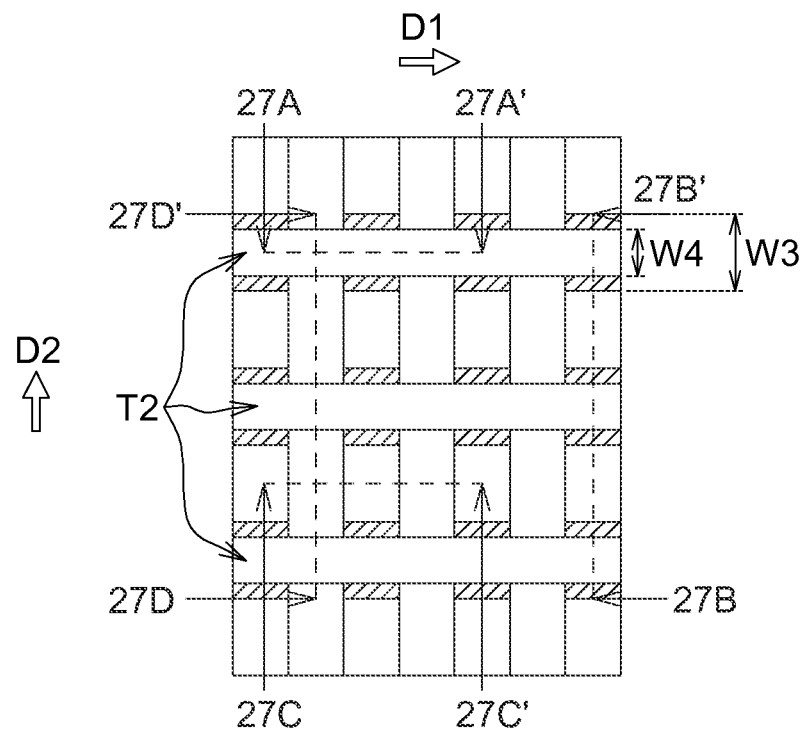
Figure 27A:
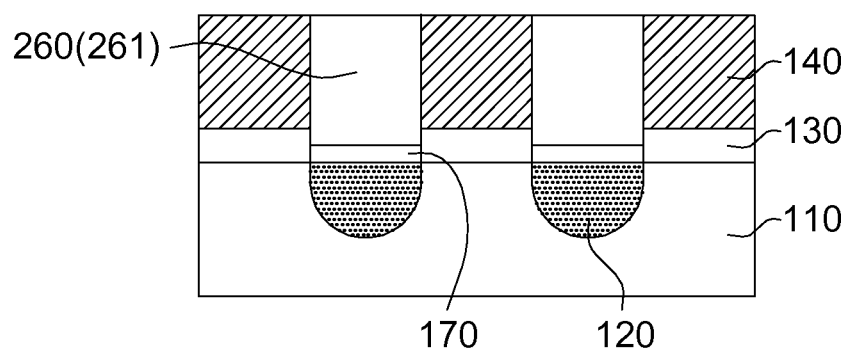
Figure 27B:
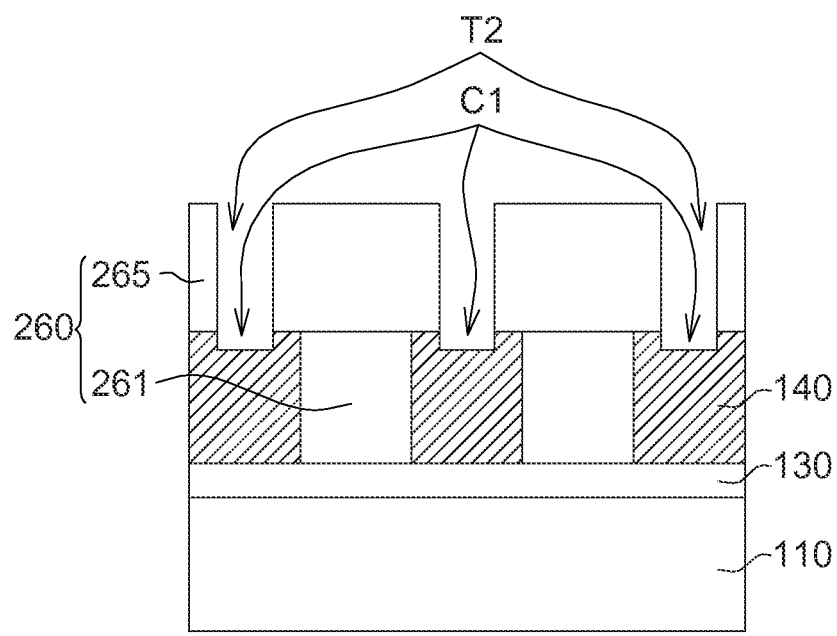
Figure 27C:
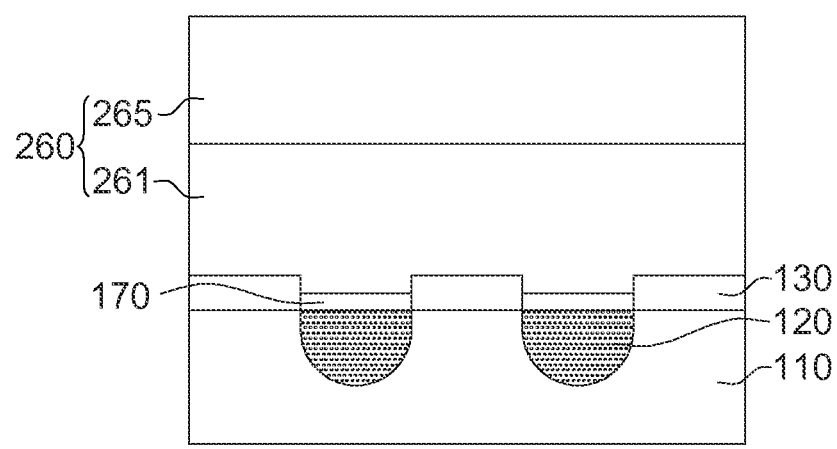
Figure 27D:
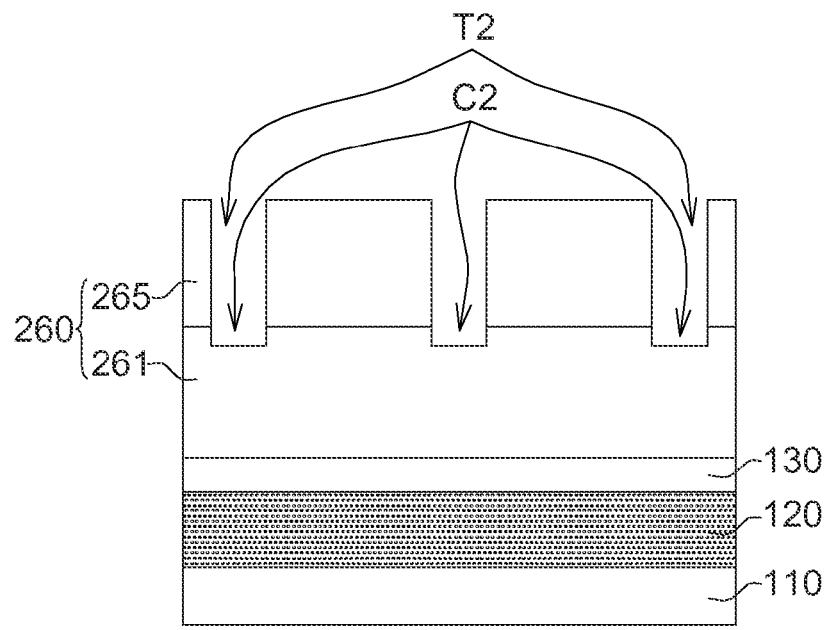

Next, referring to FIGS. 11A-11B and 21A-27D (FIG. 21B shows a cross-sectional view along the section line 21A-21A' in FIG. 21A, FIG. 22B shows a cross-sectional view along the section line 22A-22A' in FIG. 22A, FIG. 22C shows a cross-sectional view along the section line 22C-22C' in FIG. 22A, FIG. 23B shows a cross-sectional view along the section line 23A-23A' in FIG. 23A, FIG. 23C shows a cross-sectional view along the section line 23C-23C' in FIG. 23A, FIG. 25A shows a cross-sectional view along the section line 25A-25A' in FIG. 24, FIG. 25B shows a cross-sectional view along the section line 25B-25B' in FIG. 24, FIG. 25C shows a cross-sectional view along the section line 25C-25C' in FIG. 24, FIG. 27A shows a cross-sectional view along the section line 27A-27A' in FIG. 26, FIG. 27B shows a cross-sectional view along the section line 27B-27B' in FIG. 26, FIG. 27C shows a cross-sectional view along the section line 27C-27C' in FIG. 26, and FIG. 27D shows a cross-sectional view along the section line 27D-27D' in FIG. 26), the conductive damascene structures 250 are formed on the memory material layer 130, and the dielectric structure 260 is formed on the doping strips 120.

In the embodiment, the manufacturing method of forming the dielectric structure 260 comprises, for example, the following steps. As shown in FIGS. 21A-21B, the metal silicide layer 170 is optionally formed on the doping strips 120, the dielectric material layer 960a is formed on the substrate 110 and between the strip-shaped conductive material layers 940, and then the top surfaces of the dielectric material layer 960a and the conductive material layers 940 are planarized.

And then, as shown in FIGS. 22A-22C, the conductive material layers 940 are partially removed to form the conductive layers 140, providing a plurality of cavities C between the conductive material layers 940 and the dielectric material layer 960a. In the embodiment, the conductive material layers 940 are partially removed by such as a mask etching process. As shown in FIG. 22B, the structure of memory cells are simultaneously formed along with the formation of the conductive layers 140. And then, as shown in FIGS. 22A-23C, a dielectric material layer 960c are formed in the cavities C between the conductive layers 140 and the dielectric material layer 960a, followed by the planarization of the top surfaces of the dielectric material layer 960a and the dielectric material layer 960c. At present, the dielectric material layer 960a and the dielectric material layer 960c form the dielectric layer 261.

And then, as shown in FIGS. 24 and 25A-25C, a hard mask material layer 960d is formed and covering the top surfaces of the dielectric material layer 960a and the dielectric material layer 960c. And then, as shown in FIGS. 26 and 27A-27D, the hard mask material layer 960d is partially removed to form the hard mask layer 265 having a plurality of trenches T2. The dielectric layer 261 and the hard mask layer 265 form the dielectric structure 260. The dielectric structure 260 has a plurality of trenches T2, and the trenches T2 are extended in the direction D1 perpendicular to the direction D2 which the doping strips 120 are extended in. In the embodiment, the width W3 of the trenches T2 is smaller than the width W4 of the conductive layers 140. In the embodiment, the hard mask material layer 960d comprises, for example, a dielectric material and an organic material, and the trenches T2 are formed by etching away the organic material by a dry etching process or a wet etching process. In an embodiment, as shown in FIG. 27B, the conductive layers 140 are further partially removed to form a plurality of concaves C1 as the hard mask material layer 960d is etched, such that the trenches T2 are connected to the concaves C1. In an embodiment, as shown in FIG. 27D, the dielectric layer 261 is further partially removed to form a plurality of concaves C2 as the hard mask material layer 960d is etched.

Next, referring to FIGS. 3-4D, a conductive material is filled in the trenches T2 for forming the conductive damascene structures 250 on the conductive layers 140, wherein the width W3 of the conductive damascene structures 250 is smaller than the width W4 of the conductive layers 140. In an alternative embodiment, the conductive material is further filled in the concaves C2 for forming the conductive damascene structures 250, wherein an end 250a of the conductive damascene structures 250 is embedded in the conductive layers 140. As such, the semiconductor element 200 as shown in FIGS. 3-4D is formed.

In comparison with the conventional etching process for manufacturing the conductive contact structures (main body of word lines), in the embodiments of the present disclosure, the conductive damascene structures 250 are formed by a damascene process, and the width W3 of the conductive damascene structures 250 is smaller than the width W4 of the conductive layers 140, such that the variation of the widths of the conductive damascene structures 250 is reduced, the uniformity of the widths of the conductive damascene structures 250 is increased, and the distance between each of the conductive damascene structures 250 is enlarged. In an embodiment, the semiconductor element 200 is such as a memory device, and the conductive damascene structures 250 are such as the main body of the word lines. As the variation of the widths of the word lines is reduced, the probability of short-circuits between the word lines can be reduced, and the reliability, operational efficiency and production yields of the memory device can be improved.

Referring to FIGS. 5-6D, 7-10B, and 28A-33D, FIGS. 28A-33D illustrate a process for manufacturing a semiconductor element according to the third embodiment of the present disclosure.

First, as shown in FIGS. 7-10B, the substrate 110 is provided, the doping strips 120 are formed in the substrate 110, and the memory material layer 130 is formed on the substrate 110, the memory material layer 130 comprising a memory area 130a located on two sides of the doping strips 120.

Figure 28A:
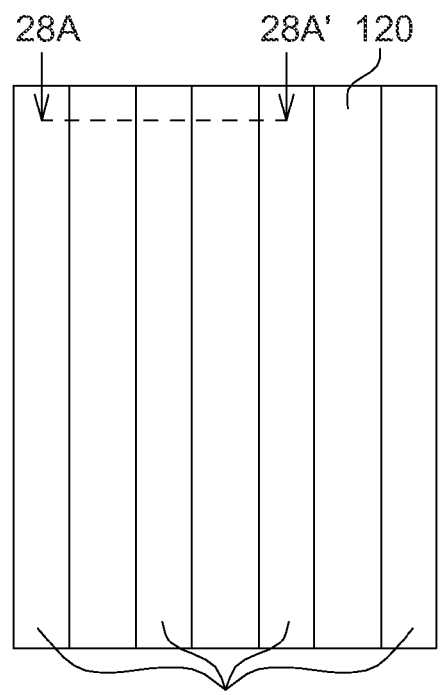
FIGS. 28A-33D illustrate a process for manufacturing a semiconductor element according to the third embodiment of the present disclosure.
Figure 28B:
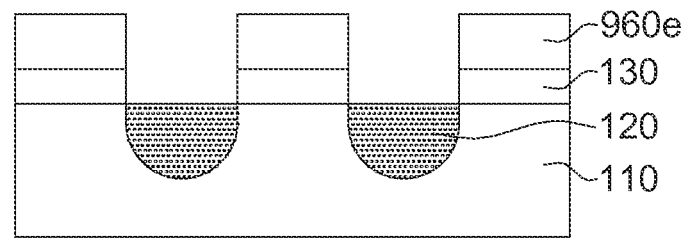
Figure 29A:
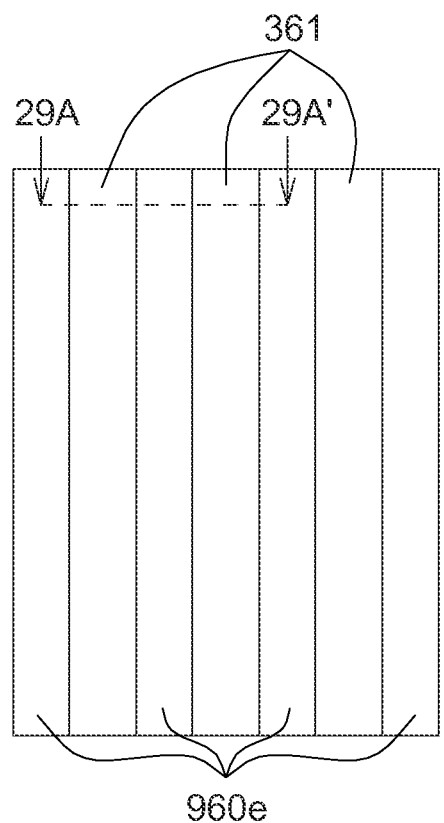
Figure 29B:
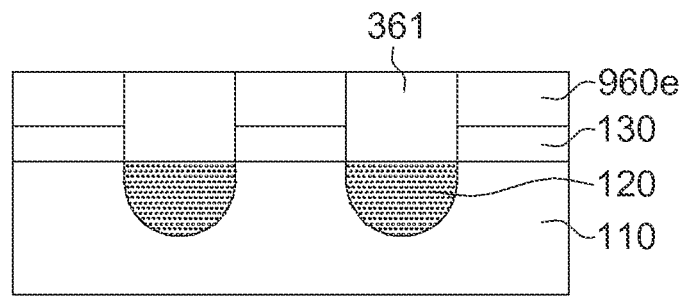
Figure 30:
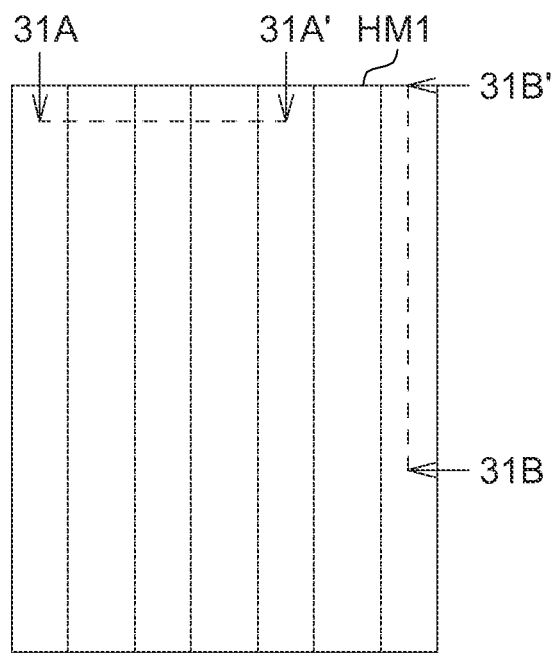
Figure 31A:
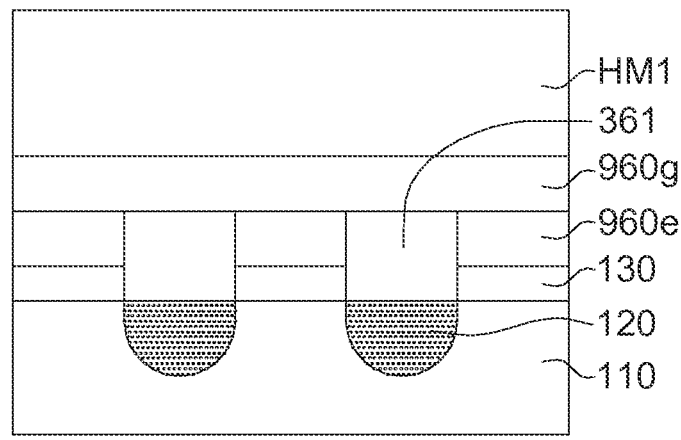
Figure 31B:
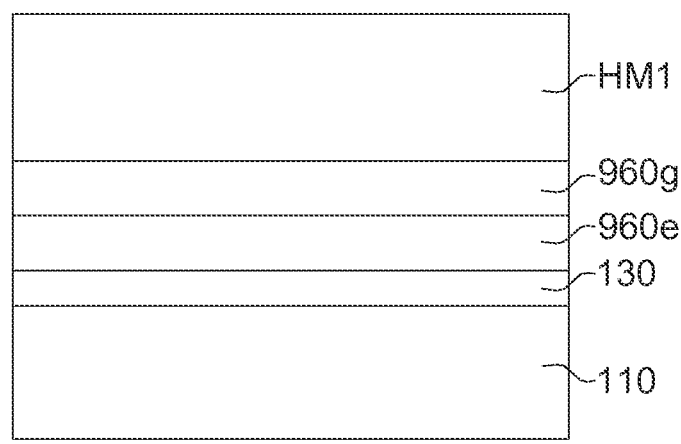
Figure 32:
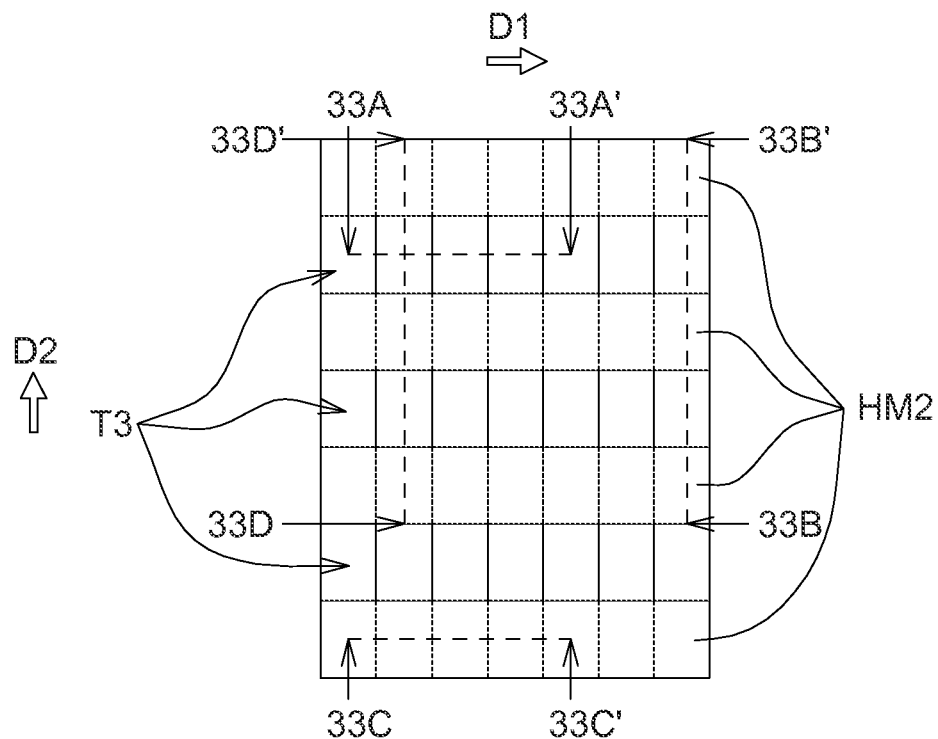
Figure 33A:
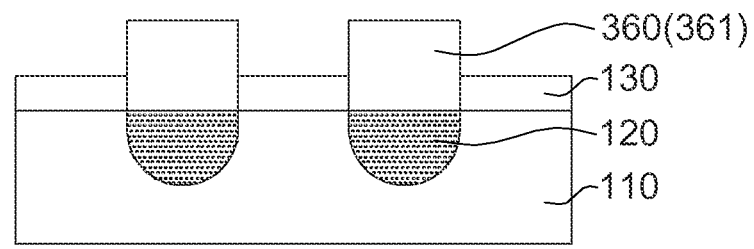
Figure 33B:
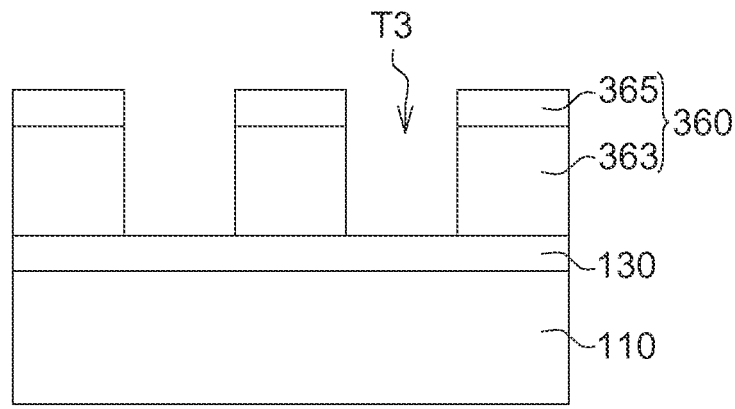
Figure 33C:
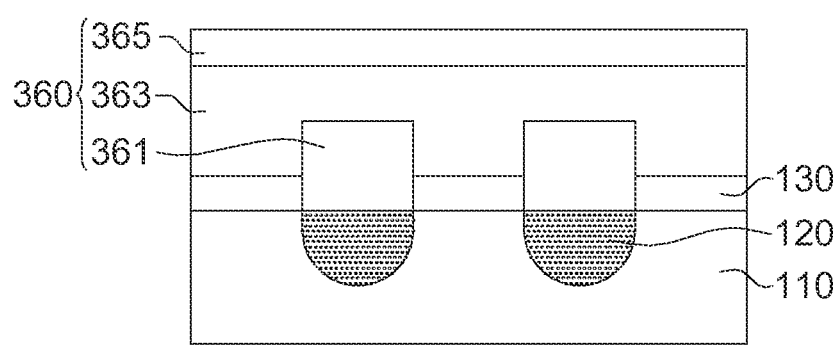
Figure 33D:
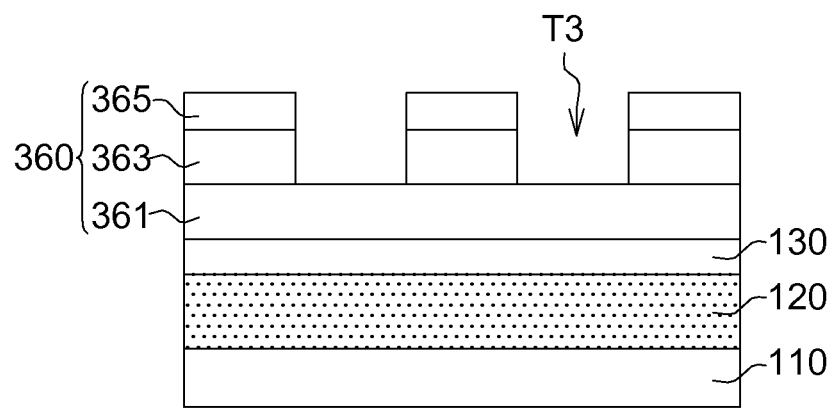

Next, referring to FIGS. 28A-33D (FIG. 28B shows a cross-sectional view along the section line 28A-28A' in FIG. 28A, FIG. 29B shows a cross-sectional view along the section line 29A-29A' in FIG. 29A, FIG. 31A shows a cross-sectional view along the section line 31A-31A' in FIG. 30, FIG. 31B shows a cross-sectional view along the section line 31B-31B' in FIG. 30, FIG. 33A shows a cross-sectional view along the section line 33A-33A' in FIG. 32, FIG. 33B shows a cross-sectional view along the section line 33B-33B' in FIG. 32, FIG. 33C shows a cross-sectional view along the section line 33C-33C' in FIG. 32, and FIG. 33D shows a cross-sectional view along the section line 33D-33D' in FIG. 32), the conductive damascene structures 350 are formed on the memory material layer 130, and the dielectric structure 360 is formed on the doping strips 120.

In the embodiment, the manufacturing method of forming the dielectric structure 360 comprises, for example, the following steps. As shown in FIGS. 28A-28B (and referring to FIGS. 7-9), strip-shaped dielectric material layers 960e and the memory material layer 130 are formed by a manufacturing process similar to that for forming the strip-shaped conductive material layers 940 as shown in FIGS. 7-9. In the embodiment, the material of the dielectric material layers 960e is a metal nitride, such as silicon nitride. And then, as shown in FIGS. 29A-29B, the first dielectric layer 361 is deposited on the doping strips 120 between the strip-shaped dielectric materials layers 960e, followed by the planarization of the top surfaces of the first dielectric layer 361 and the dielectric material layers 960e. In the embodiment, the material of the first dielectric layer 361 is a metal oxide, such as silicon oxide.

And then, as shown in FIGS. 30 and 31A-31B, a hard mask layer HM1 and a dielectric material layer 960g are formed and covering the whole top surfaces of the first dielectric layer 361 and the dielectric material layers 960e. In the embodiment, the dielectric material layer 960g and the dielectric material layers 960e are formed from, for example, the same material(s). The material of the hard mask layer HM1 comprises, for example, a metal oxide and an organic material, which can be removed by oxygen.

And then, as shown in FIGS. 32 and 33A-33D, the hard mask layer HM1, the dielectric material layers 960e, and the dielectric material layer 960g are partially removed for forming the trenches T3. In the embodiment, the hard mask layer HM1, the dielectric material layers 960e, and the dielectric material layer 960g are partially removed by such as an etching process. At present, the dielectric material layers 960e and the dielectric material layer 960g form the second dielectric layer 363 on the first dielectric layer 361, and the etched and thinned hard mask layer HM1 forms the hard mask layer 365 on the second dielectric layer 363. The first dielectric layer 361, the second dielectric layer 363, and the hard mask layer 365 form the dielectric structure 360. The dielectric structure 360 has a plurality of trenches T3, and the trenches T3 are extended in the direction D1 perpendicular to the direction D2 which the doping strips 120 are extended in. In the embodiment, the first dielectric layer 361 and the second dielectric layer 363 are formed of different materials. The trenches T3 are located in the hard mask layer 365 and the second dielectric layer 363, and the hard mask layer 365 and the second dielectric layer 363 are formed of different materials.

Next, referring to FIGS. 5-6D, a conductive material is filled in the trenches T3 for forming the conductive damascene structures 350. The conductive material is such as polysilicon. As such, the semiconductor element 300 as shown in FIGS. 5-6D is formed.

In comparison with the conventional etching process for manufacturing the conductive contact structures (main body of word lines), in the embodiments of the present disclosure, the whole conductive damascene structures 350 are formed by a damascene process, such that the variation of the widths of the conductive damascene structures 350 is reduced. In an embodiment, the semiconductor element 300 is such as a memory device, and the conductive damascene structures 350 are such as the word lines. As the variation of the widths of the word lines is reduced, the probability of short-circuits between the word lines caused by residual conductive materials can be reduced, and the operational efficiency and production yields of the memory device can be improved.

Figure 34:
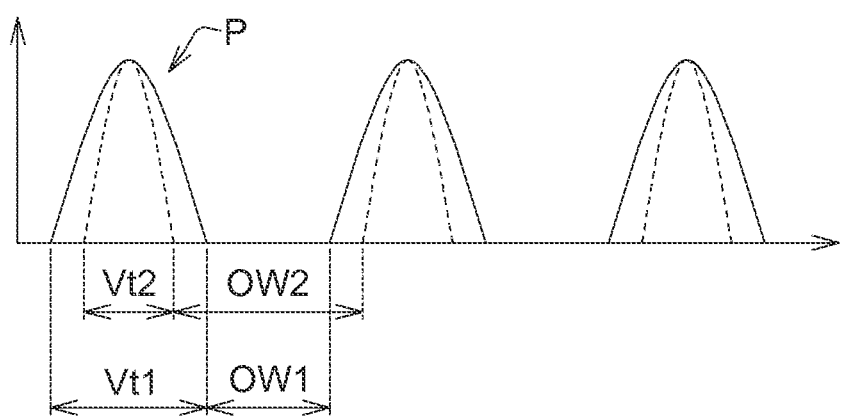
FIG. 34 illustrates a voltage (Vt) distribution curve of a semiconductor element according to an embodiment of the present disclosure.

FIG. 34 illustrates a voltage (Vt) distribution curve of a semiconductor element according to an embodiment of the present disclosure. The Vt distribution curve P includes a plurality of peaks, each of which has a Vt distribution. When the variation of the widths of the conductive damascene structures is reduced, the uniformity of the widths of the conductive damascene structures is increased, the Vt distribution decreases from Vt1 to Vt2, such that the product open window between adjacent peaks increases from OW1 to OW2. Accordingly, the probability of failures of the semiconductor element is reduced, and hence the operational efficiency of the memory device can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor element, comprising:
a substrate;
a plurality of doping strips formed in the substrate;
a memory material layer formed on the substrate, the memory material layer comprising a memory area located on two sides of each of the plurality of doping strips;
a plurality of conductive damascene structures formed on the memory material layer;
a conductive layer formed between each of the plurality of conductive damascene structures and the memory material layer; and
a dielectric structure formed on the each of the plurality of doping strips and between the each of the plurality of conductive damascene structures;
wherein the each of the plurality of conductive damascene structures are extended in a direction perpendicular to a direction which the each of the plurality of doping strips are extended in, an end of the each of the plurality of conductive damascene structures is embedded in a corresponding conductive layer and the dielectric structure, and a bottom surface of the end is connected to a bottom surface of a concave region in the dielectric structure.

2. The semiconductor element according to claim 1, wherein a width of the each of the plurality of conductive damascene structures is smaller than a width of the corresponding conductive layer.

3. The semiconductor element according to claim 1, wherein the corresponding conductive layer is formed of polysilicon or doped silicon.

4. The semiconductor element according to claim 1, wherein the conductive damascene structures are formed of a metallic material or polysilicon.

5. The semiconductor element according to claim 1, further comprising a metal silicide layer formed on the each of the plurality of doping strips.

* * * * *